United States Patent
Tsukamura et al.

(10) Patent No.: US 8,047,637 B2
(45) Date of Patent: Nov. 1, 2011

(54) PIEZOELECTRIC ACTUATOR AND MANUFACTURING METHOD THEREOF, LIQUID EJECTING HEAD, AND IMAGE FORMING APPARATUS

(75) Inventors: Kiyoshi Tsukamura, Kanagawa (JP); Kenichiroh Hashimoto, Kanagawa (JP); Kiyoshi Yamaguchi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/814,282

(22) Filed: Jun. 11, 2010

(65) Prior Publication Data

US 2010/0245490 A1    Sep. 30, 2010

Related U.S. Application Data

(63) Continuation of application No. 11/786,469, filed on Apr. 10, 2007, now Pat. No. 7,764,006.

(30) Foreign Application Priority Data

Apr. 14, 2006 (JP) ................... 2006-112712
Feb. 19, 2007 (JP) ................... 2007-038610

(51) Int. Cl.
*B41J 2/045* (2006.01)
*H01L 41/053* (2006.01)
*H01L 41/22* (2006.01)

(52) U.S. Cl. ............ 347/68; 347/71; 310/348; 29/25.35

(58) Field of Classification Search ............... 347/71, 347/72
See application file for complete search history.

(56) References Cited

U.S. PATENT DOCUMENTS

| | | | |
|---|---|---|---|
| 4,385,255 A | 5/1983 | Yamaguchi et al. | |
| 5,394,049 A | 2/1995 | Luecke | |
| 6,161,925 A | 12/2000 | Reinten et al. | |
| 6,536,868 B1 | 3/2003 | Kawamura et al. | |
| 7,338,570 B2 * | 3/2008 | Terakura | 156/83 |
| 2002/0186278 A1 | 12/2002 | Nakamura et al. | |
| 2004/0017440 A1 | 1/2004 | Takayama et al. | |
| 2004/0227432 A1 | 11/2004 | Takahashi | |
| 2005/0012787 A1 | 1/2005 | Yamaguchi et al. | |
| 2005/0017601 A1 | 1/2005 | Hiyoshi | |
| 2006/0233578 A1 | 10/2006 | Maki et al. | |
| 2007/0257968 A1 | 11/2007 | Hashimoto et al. | |

FOREIGN PATENT DOCUMENTS

| | | |
|---|---|---|
| EP | 0819524 A1 | 1/1998 |
| EP | 0921003 A1 | 6/1999 |
| EP | 1078759 A2 | 2/2001 |
| JP | 8-108534 | 4/1996 |
| JP | 8-142325 | 6/1996 |
| JP | 3114771 | 9/2000 |
| JP | 2000-351217 | 12/2000 |
| JP | 3156411 | 2/2001 |
| JP | 2003-250281 | 9/2003 |
| WO | WO2006/057207 A1 | 6/2006 |

\* cited by examiner

*Primary Examiner* — Matthew Luu
*Assistant Examiner* — Lisa Solomon
(74) *Attorney, Agent, or Firm* — Cooper & Dunham LLP

(57) ABSTRACT

A piezoelectric actuator is disclosed. The piezoelectric actuator includes a base member and three or more piezoelectric element members in which plural piezoelectric elements are formed by slits. The three or more piezoelectric element members are arrayed in a line on the base member and a gap is formed at the connection position between two adjacent piezoelectric element members.

11 Claims, 35 Drawing Sheets

PIEZOELECTRIC ACTUATOR AND MANUFACTURING METHOD THEREOF, LIQUID EJECTING HEAD, AND IMAGE FORMING APPARATUS

CROSS-REFERENCE TO RELATED APPLICATION

This application is a Rule 1.53(b) continuation of application Ser. No. 11/786,469, filed Apr. 10, 2007, now U.S. Pat. No. 7,764,006 the entire contents of which are incorporated herein by reference.

BACKGROUND

1. Technical Field

This discloses generally relates to a piezoelectric actuator and a manufacturing method thereof, a liquid ejecting head, and an image forming apparatus.

2. Description of the Related Art

Generally, in a printer, a facsimile, a copier, and an image forming apparatus having the above multiple functions, a liquid ejecting head ejects liquid (ink) droplets of recording liquid, adheres the recording liquid on a recording medium which is carried, and an image is formed on the recording medium.

In this case, the image forming apparatus includes an image recording apparatus, an image printing apparatus, a character writing apparatus, and so on; and forms an image on a recording medium formed of materials such as paper, cloth, leather, metal, glass, plastic, wood, ceramics, and so on. In the image forming, in addition to forming characters and pictures on the recording medium, pattern forming and so on are included.

As the liquid ejecting head, a piezoelectric type head which uses a piezoelectric actuator is well known. In the piezoelectric actuator, a piezoelectric element is used as a pressure generating unit which generates pressure to apply liquid (ink) in a liquid chamber, especially, a stacked type piezoelectric element in which piezoelectric layers and electrode layers are alternately stacked is used, and an elastically deformable vibration plate of which a wall of the liquid chamber is formed is deformed by displacement in the d33 direction or the d31 direction of the stacked type piezoelectric element. With this, the liquid ejecting head ejects liquid droplets by a change of the volume/the pressure of the liquid chamber caused by the deformation of the vibration plate.

In Patent Document 1, an inkjet head is disclosed. In the inkjet head, piezoelectric layers and internal electrodes are alternately stacked, and an individual side external electrode is formed at one side of the stacked body and a common side external electrode is formed at the other side of the stacked body; with this, a stacked type piezoelectric element (driving element block) is formed. By applying a groove forming process to the main part of the driving element block, plural drive sections (driving channels) are formed at the main part and non-drive sections are formed one at each side. Pressure is applied to liquid in a liquid chamber by using displacement in the d31 direction of the stacked type piezoelectric element and the common side external electrodes are disposed at the non-driving sections positioned at both ends in the arraying direction of the stacked type piezoelectric elements.

In Patent Document 2, a stacked type piezoelectric element using displacement in the d33 direction is disclosed. In the stacked type piezoelectric element, a groove forming process is applied to a piezoelectric element formed on a base plate and piezoelectric elements connecting to corresponding liquid chambers having a nozzle are formed.

In Patent Document 3, a line type inkjet head is disclosed. In the line type inkjet head, plural nozzle openings are arrayed on one nozzle plate, a piezoelectric element is disposed at each nozzle opening by processing plural bulk type piezoelectric elements, and a boundary between two adjacent bulk type piezoelectric elements is a part in which a gap is formed therebetween.

In Patent Document 4, a manufacturing method of an inkjet head is disclosed. In the inkjet head, plural liquid ejecting heads are connected.

[Patent Document 1] Japanese Laid-Open Patent Application No. 8-142325

[Patent Document 2] Japanese Laid-Open Patent Application No. 2003-250281

[Patent Document 3] Japanese Patent No. 3156411

[Patent Document 4] Japanese Laid-Open Patent Application No. 2000-351217

However, recently, an image forming apparatus (for example, an inkjet recording apparatus) has been required to perform high-speed printing. In order to satisfy the high-speed printing requirement, the liquid droplet ejecting frequency must be high or the number of nozzles must be large. When the liquid droplet ejecting frequency is high, a carriage for carrying the recording head must be moved at high speed, and a high power motor of the carriage must be accurately controlled. Consequently, in order to execute a stable ejection of liquid droplets at high frequency, the cost of the apparatus is increased.

When a long-length recording head is used for increasing the number of nozzles in the recording head having the piezoelectric actuator in Patent Documents 1 and 2, all the elements in the recording head must be long. Especially, a PZT (piezoelectric transducer) which is a typical piezoelectric element is a very thin and long component; therefore, it is very difficult to manufacture and handle a much longer PZT.

In addition, in the line type inkjet head in Patent Document 3, the piezoelectric element is formed by dividing the bulk type piezoelectric element; therefore, chipping and failing of the piezoelectric element is likely to occur. Consequently, the yield is decreased and the cost is increased.

In addition, in Patent Document 4, since the plural liquid ejecting heads are connected, the size of the recording head becomes large; consequently, the size of the apparatus becomes large.

BRIEF SUMMARY

In an aspect of this disclosure, there is provided a piezoelectric actuator having a long length and low cost, a manufacturing method thereof, a liquid ejecting head having the piezoelectric actuator, and an image forming apparatus having the liquid ejecting head.

In another aspect of this disclosure, there is provided a piezoelectric actuator that includes a base member and three or more piezoelectric element members in which plural piezoelectric elements are formed by slits. The three or more piezoelectric element members are arrayed in a line on the base member and at least a part of the slit is formed at a connection position between two adjacent piezoelectric element members.

According to another aspect of this disclosure, there is provided a manufacturing method of a piezoelectric actuator which includes three or more piezoelectric element members on a base member. The manufacturing method includes a step that secures the three or more piezoelectric element members in a line on the base member, and a step that forms slits in the three or more piezoelectric element members so as to form plural piezoelectric elements in each of the three or more piezoelectric element members.

According to another aspect of this disclosure, there is provided an image forming apparatus which forms an image on a recording medium. The image forming apparatus includes a liquid ejecting head which ejects recording liquid on the recording medium for forming the image on the recording medium. The liquid ejecting head includes a nozzle that ejects liquid, a liquid chamber connected to the nozzle, a vibration plate of which at least one wall of the liquid chamber is formed, and a piezoelectric actuator that deforms the vibration plate. The piezoelectric actuator includes a base member, and three or more piezoelectric element members in which plural piezoelectric elements are formed by slits. The three or more piezoelectric element members are arrayed in a line on the base member and a gap is formed at a connection position between two adjacent piezoelectric element members.

According to an embodiment, a piezoelectric actuator includes a base member and three or more piezoelectric element members in which plural piezoelectric elements are formed by slits. The three or more piezoelectric element members are arrayed in a line on the base member and at least a part of the slit is formed at a connection position between the two adjacent piezoelectric element members. Therefore, a long-length piezoelectric actuator can be formed at low cost.

According to an embodiment, a manufacturing method of a piezoelectric actuator includes a step that secures three or more piezoelectric element members in a line on a base member, and a step that forms slits in the three or more piezoelectric element members so as to form plural piezoelectric elements in each of the three or more piezoelectric element members. Therefore, a long-length piezoelectric actuator can be formed at low cost.

According to another aspect of this disclosure, an image forming apparatus includes a liquid ejecting head which ejects recording liquid on a recording medium for forming an image on the recording medium. The liquid ejecting head includes a nozzle that ejects liquid, a liquid chamber connected to the nozzle, a vibration plate of which at least one wall of the liquid chamber is formed, and a piezoelectric actuator that deforms the vibration plate. The piezoelectric actuator includes a base member, and three or more piezoelectric element members in which plural piezoelectric elements are formed by slits. The three or more piezoelectric element members are arrayed in a line on the base member and a gap is formed at a connection position between two adjacent piezoelectric element members. Therefore, an image forming apparatus can be realized in which an image is formed at high speed with low cost.

BRIEF DESCRIPTION OF THE DRAWINGS

Features and advantages of the present invention will become more apparent from the following detailed description when read in conjunction with the accompanying drawings, in which.

DESCRIPTION OF THE PREFERRED EMBODIMENTS

Best Mode of Carrying Out the Invention

The best mode of carrying out the present invention is described with reference to the accompanying drawings.

First Embodiment

Figure 1:
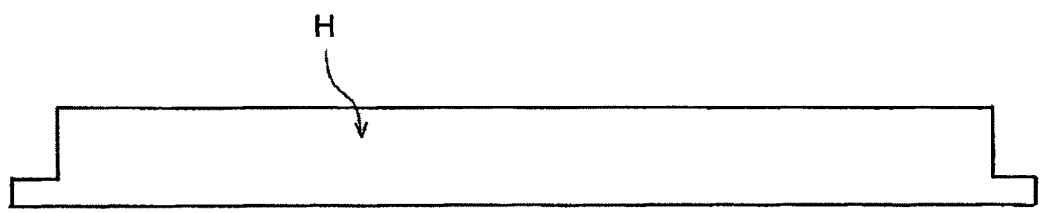
FIG. 1 is a side view of a liquid ejecting head according to a first embodiment of the present invention.
Figure 2:
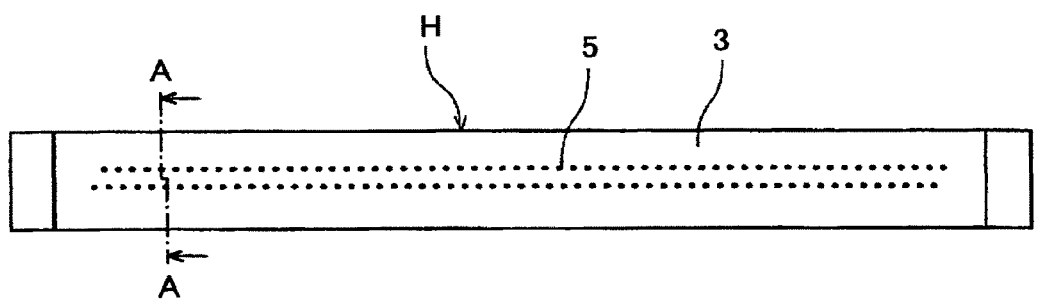
FIG. 2 is a plan view of the liquid ejecting head according to the first embodiment of the present invention.
Figure 3:
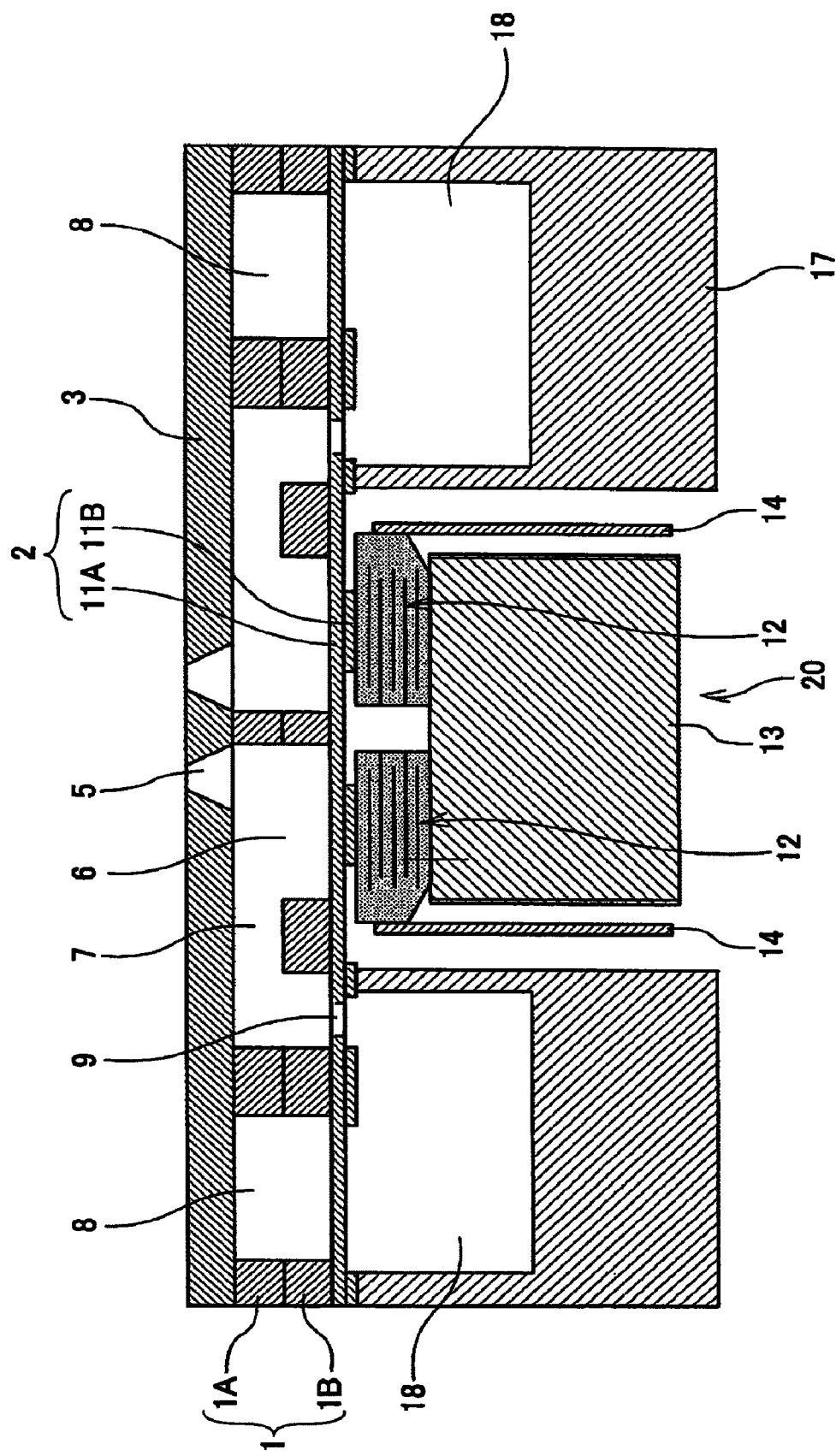
FIG. 3 is a cross-sectional view of the liquid ejecting head along line A-A of FIG. 2.
Figure 4:
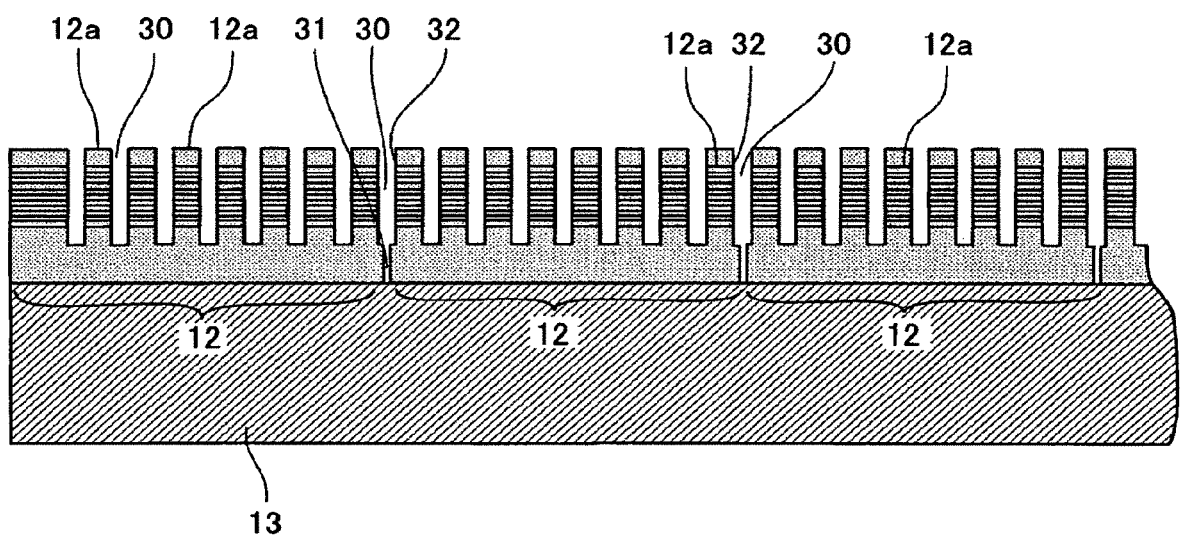
FIG. 4 is a cut-away side view of a part of the liquid ejecting head shown in FIG. 2 in the long-length direction of the liquid ejecting head.

Referring to FIGS. 1 through 4, a liquid ejecting head having a piezoelectric actuator according to a first embodiment of the present invention is described. FIG. 1 is a side view of a liquid ejecting head H according to the first embodiment of the present invention. FIG. 2 is a plan view of the liquid ejecting head H according to the first embodiment of the present invention. FIG. 3 is a cross-sectional view of the liquid ejecting head H along line A-A of FIG. 2. FIG. 4 is a cut-away side view of a part of the liquid ejecting head H shown in FIG. 2 in the long-length direction of the liquid ejecting head H.

The liquid ejecting head H includes a liquid chamber base plate 1 (liquid flowing route base plate) formed of SUS (stainless used steel), a vibration plate 2 adhered to the lower surface of the liquid flowing route base plate 1, and a nozzle plate 3 adhered to the upper surface of the liquid flowing route base plate 1. By the liquid flowing route base plate 1, the vibration plate 2, and the nozzle plate 3; a pressure applying liquid chamber 6 connecting to a nozzle 5 from which ink droplets (liquid) are ejected, a fluid resistance section 7 also operating as a supplying route of recording liquid (ink) to the pressure applying liquid chamber 6, and a buffer chamber 8 which prevents a pressure change in a common liquid chamber (described below) are formed. In some cases, the pressure applying liquid chamber 6 is referred to as a liquid chamber, a pressure chamber, or a pressure applying chamber.

The liquid flowing route base plate 1 is formed of a restrictor plate 1A and a chamber plate 1B by being adhered. Cavities such as the pressure applying liquid chamber 6, the fluid resistance section 7, and the buffer chamber 8 are formed by etching a SUS base plate with the use of an acid etching liquid or by applying a mechanical punching process. The fluid resistance section 7 is formed by removing a part of the restrictor plate 1A without removing a part of the chamber plate 1B.

The vibration plate 2 is adhered to the chamber plate 1B of the liquid flowing route base plate 1. In the vibration plate 2, convex sections 11B formed of a SUS plate are adhered to a resin member 11A formed of, for example, polyimide. In addition, the vibration plate 2 can be formed of, for example, a nickel plate.

In the nozzle plate 3, the nozzles 5 having a 10 to 30 μm diameter are formed corresponding to the pressure applying liquid chambers 6. The nozzle plate 3 is adhered to the restrictor plate 1A of the liquid flowing route base plate 1. The nozzle plate 3 can be formed of a metal plate, for example, a stainless steel plate, or a nickel plate; a resin film, for example, a polyimide film; a silicon plate, or a material combining the above. In addition, on the liquid ejecting surface of the nozzle plate 3, in order to form liquid repellency, a repellent film is formed by a well-known process such as a plating process or a repellent material coating process.

On the lower surface of the vibration plate 2 (on the surface opposite to face the pressure applying liquid chamber 6), stacked type piezoelectric elements 12a (pressure generating units) are adhered to the corresponding pressure applying liquid chambers 6. Piezoelectric element members 12 formed of the stacked type piezoelectric elements 12a are adhered to a base member 13. In the present embodiment, a piezoelectric actuator 20 which deforms the vibration plate 2 as a movable member is formed of the piezoelectric element members 12 and the base member 13.

In the liquid ejecting head H, the plural stacked type piezoelectric elements 12a are formed by a slitting process (grooving process) without being separated from each other. The piezoelectric element member 12 is formed of the plural stacked type piezoelectric elements 12a. Three or more piezoelectric element members 12 are disposed on the base member 13 with a gap 31 between each two adjacent piezoelectric element members 12 in the long-length direction of the piezoelectric element members 12 (in the direction arraying the plural stacked type piezoelectric elements 12a).

In this case, as described below, after adhering the surfaces of the plural piezoelectric element members 12 on the base member 13 which surfaces face the direction opposite to the vibration plate 2, grooves 30 are formed in the plural piezoelectric element members 12. With this, the plural stacked type piezoelectric elements 12a are formed. In addition, a FPC (flexible printed circuit) cable 14 is connected to one end of the piezoelectric element member 12 for applying a driving waveform to each stacked type piezoelectric element 12a.

In addition, in the piezoelectric direction of the stacked type piezoelectric element 12a, pressure can be applied to liquid in the pressure applying liquid chamber 6 by using displacement in the d33 direction or in the d31 direction. In the present embodiment, the displacement in the d33 direction is used.

The base member 13 is preferable to be formed of a metal material. When the base member 13 is formed of a metal material, heat accumulation caused by self-heating of the stacked type piezoelectric elements 12a (the piezoelectric element member 12) can be prevented. The piezoelectric element member 12 is adhered to the base member 13 by an adhesive; however, when the number of channels (pressure applying liquid chambers 6) becomes large, temperature rises to approximately 100° C. by the self-heating of the piezoelectric element member 12, and the adhesive strength is remarkably lowered. In addition, when temperature in the liquid ejecting head H rises by the self-heating, ink (liquid) temperature rises. When the ink temperature rises, the viscosity of the ink is decreased and the ink ejecting performance is lowered. Therefore, by forming the base member 13 of a metal material, the heat accumulation caused by the self-heating of the stacked type piezoelectric elements 12a is prevented, and lowering the ink ejecting performance caused by low adhesive strength and low ink viscosity can be prevented.

In addition, when the linear expansion coefficient of the base member 13 is large, an adhesive may be removed at the boundary between the base member 13 and the piezoelectric element member 12 at high temperature or low temperature. Conventionally, the length of the liquid ejecting head H is not long; therefore, removing the piezoelectric element member 12 from the base member 13 caused by a temperature change (environmental change) may not occur. However, when the piezoelectric element members 12 of a 30 to 40 mm length having approximately 400 nozzles at 300 dpi are used, peeling off at the boundary between the base member 13 and the piezoelectric element member 12 remarkably occurs.

Therefore, it is preferable that the base member 13 be formed of a material whose linear expansion coefficient is 10E-6/° C. or less. When a material having the above linear expansion coefficient is used, the piezoelectric element member 12 being peeled off from the base member 13 at the boundary caused by a temperature difference due to an environmental change can be prevented. Especially, when the linear expansion coefficient of the base member 13 which is adhered to the piezoelectric element member 12 is 10E-6/° C. or less, peeling off at the boundary between the piezoelectric element member 12 and base member 13 can be remarkably prevented.

In addition, plural driver ICs (not shown) for applying a driving waveform (electric signal) to each pressure applying liquid chamber 6 (each channel) are provided on the FPC cable 14. Since the plural driver ICs are provided in the FPC cable 14, an electric signal can be generated by each driver IC, and the dispersion of the displacement characteristics of the stacked type piezoelectric elements 12a for the channels can be easily corrected.

In addition, a frame member 17 is adhered to the rim bottom surface of the vibration plate 2. In the frame member 17, common liquid chambers 18 for supplying ink to the pressure applying liquid chambers 6 are formed. The common liquid chambers 18 are formed to sandwich at least the driver ICs and the base member 13. The common liquid chamber 18 is connected to the fluid resistance section 7 and the pressure applying liquid chamber 6 via a through hole 9 formed in the vibration plate 2.

As described above, in the piezoelectric actuator 20 of the liquid ejecting head H, three or more piezoelectric members 12 are arrayed at least in a line (in a two-line arrangement in the liquid ejecting head H) in which the piezoelectric element members 12 have the plural stacked type piezoelectric elements 12a separated by the grooves (slits) 30. As shown in FIG. 4, the piezoelectric members 12 are separated by slit sections 32 formed between each two adjacent piezoelectric members 12.

As described above, the three or more piezoelectric element members 12 are arrayed and the plural stacked type piezoelectric elements 12a are formed in each of the piezoelectric element members 12 by a grooving process. With this, a position shift among the piezoelectric element members 12 can be small, and a long-length piezoelectric actuator can be obtained at low cost without individually handling the fragile stacked type piezoelectric elements 12a having the grooves 30.

In addition, as described above, at least three or more piezoelectric element members 12, each of which has plural stacked type piezoelectric elements 12a separated by the grooves 30, are arrayed at least in a line with a slit section 32 between each two adjacent piezoelectric element members 12. With this, the liquid ejecting head H having a long length can be obtained at low cost.

In addition, when the slit section 32 is formed between two adjacent piezoelectric element members 12, thermal expansion of the piezoelectric element members 12 can be absorbed.

In the liquid ejecting head H, when a driving pulse voltage of 20 to 50 V is selectively applied to a stacked type piezoelectric element 12a, the stacked type piezoelectric element 12a is expanded in the stacked direction and deforms the vibration plate 2 in the direction of the nozzle 5. With this, pressure is applied to recording liquid in the pressure applying liquid chamber 6 due to a change of the volume of the pressure applying liquid chamber 6, and liquid droplets are ejected from the nozzle 5.

After this, liquid pressure in the pressure applying liquid chamber 6 is lowered by the ejection of the liquid droplets and small negative pressure is generated in the pressure applying liquid chamber 6 due to liquid flow inertia. Under this condition, when the voltage applied to the stacked type piezoelectric element 12a is turned off, the vibration plate 2 returns to the original position and the shape of the pressure applying liquid chamber 6 is returned to the original shape; therefore, negative pressure is further generated in the pressure applying liquid chamber 6. With this, liquid (ink) is supplied into the pressure applying liquid chamber 6 via the common liquid chamber 18 and the fluid resistance section 7 (ink supplying route). After the vibration of the ink meniscus surface of the nozzle 5 is attenuated and the vibration plate 2 becomes stable, a pulse voltage is applied to the stacked type piezoelectric element 12a for next ejection of ink, and liquid droplets are ejected.

In the present embodiment, the liquid droplets are ejected by a pushing method; however, a pulling method or a pulling and pushing method can be applied. In the pulling method, after the fall of electric potential from the status of applying midpoint potential to the stacked type piezoelectric element 12a, the electric potential is raised to the midpoint potential. In the pulling and pushing method, after the fall of electric potential from the status of applying midpoint potential to the stacked type piezoelectric element 12a, the electric potential is raised to greater potential than the midpoint potential. The above methods can be used by changing the driving waveform.

Figure 5:
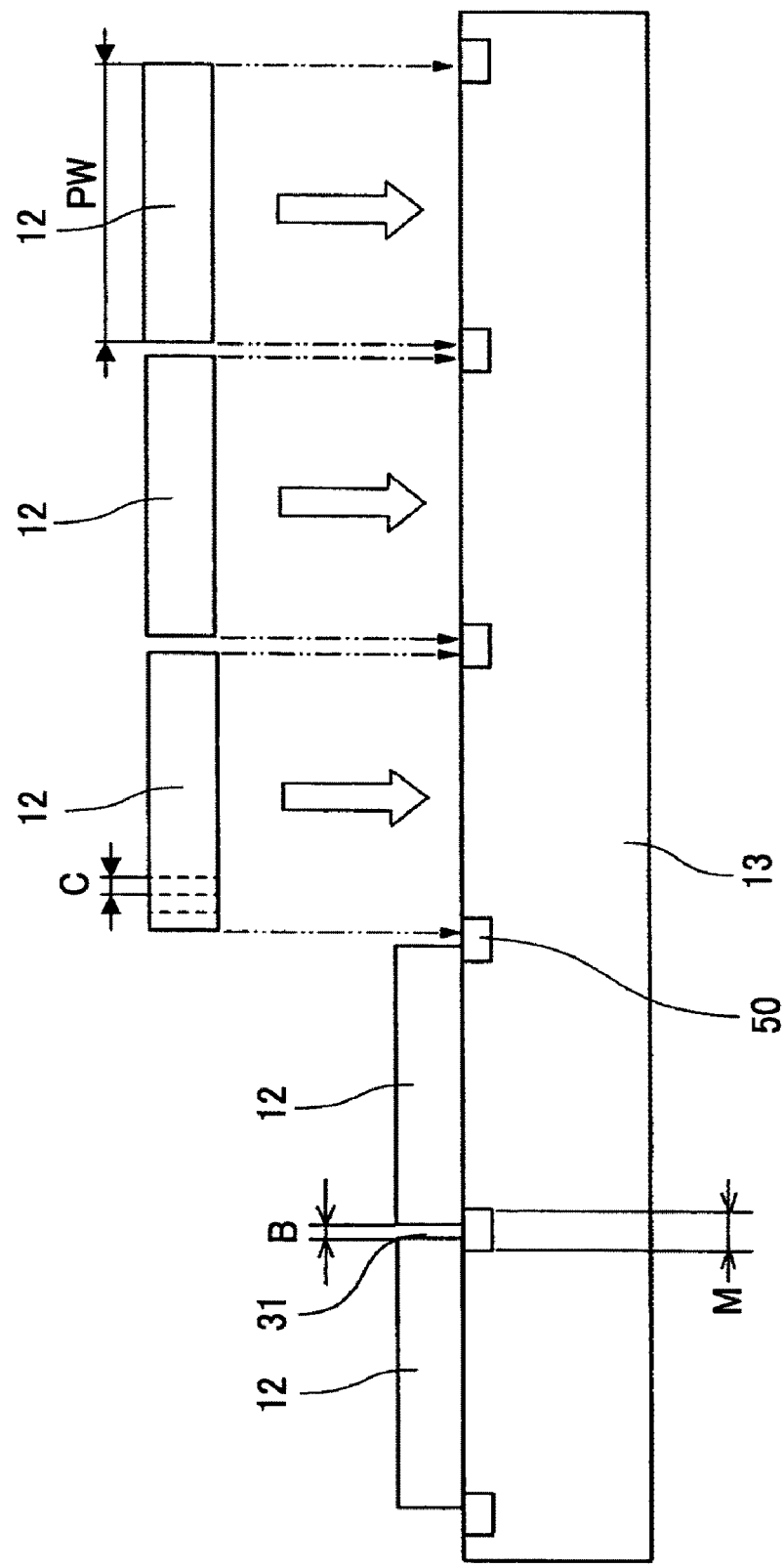
FIG. 5 is a cut-away side view showing a process for manufacturing a piezoelectric actuator.

Next, referring to FIG. 5, a manufacturing method of the piezoelectric actuator 20 according to the first embodiment of the present invention is described. FIG. 5 is a cut-away side view showing a process for manufacturing the piezoelectric actuator 20. In FIG. 5, members which become the piezoelectric actuator 20 are shown in which the grooves 30 (slits) are not formed.

In FIG. 5, the piezoelectric actuator 20 is formed by arraying three or more piezoelectric element members 12 on the base member 13 of a long length. After arraying members which become the piezoelectric element members 12, grooves (slits) are formed by slitting the members, and the plural stacked type piezoelectric elements 12a are formed in the piezoelectric element member 12. In order to form the plural stacked type piezoelectric elements 12a with the same interval (pitch), the connection part between the two adjacent piezoelectric element members 12 must be positioned within the width of the slit (groove). When the connection part is accurately positioned, a long-length piezoelectric actuator can be formed.

Therefore, in the present embodiment, the piezoelectric element member 12 whose length is accurately formed is used. That is, the length of the piezoelectric element member 12 is determined so that the groove (slit) is positioned at the connection part between the two adjacent piezoelectric element members 12.

Specifically, for example, the "n" grooves 30 (slits) are formed in one piezoelectric element member 12 (the number of the stacked type piezoelectric elements 12a is "n+1"). In this case, when the width of the groove 30 is defined as B, the width of the convex part of the stacked type piezoelectric element 12a is defined as C, the length PW of the piezoelectric element member 12 must satisfy Inequality $(B+C) \times (n+1) \geq PW > B \times n + C(n+1)$, and the accuracy of the length is $\pm 5$ μm or less.

In addition, when the piezoelectric element members 12 are arrayed on the base member 13, an index 50 showing the width (position) of the groove (slit) 30 positioned between the two adjacent piezoelectric element members 12 is provided. Then the two adjacent piezoelectric electric members 12 are arrayed so that the ends thereof are positioned within the index 50. The index 50 can be formed in the base member 13 or formed in a member different from the base member 13 attached thereto. The index 50 can be a groove formed by dicing, a mark by painting, or resist by a photolithography process.

When the index 50 is formed of a groove, the index 50 has a concave shape facing the piezoelectric element member 12. The width M of the index 50 (the width of the concave part) and the width B of the groove (slit) 30 has a relationship showing Inequality $M \leq B$. In addition, the pitch between the centers of the indexes 50 in the arraying direction of the piezoelectric element members 12 is the distance $(B+C) \times (n+1)$.

By arraying the piezoelectric element members 12 on the base member 13 so that the ends thereof are positioned within the index 50, the ends are positioned at places where the groove 30 is formed.

The piezoelectric element members 12 are adhered to the base member 13 by coating, for example, an anaerobic adhesive on the surface of the base member 13, and by applying pressure to the piezoelectric element members 12. As the adhesive, a UV hardening adhesive can be mixed and other adhesives can be used. In addition, for forming the index 50, a precision mechanical process, a precision photo printing process, or an etching process can be used. Further, the shape of the index 50 is not limited to the concave shape and can be one of other shapes.

Next, referring to FIGS. 6 through 9, a forming method of the groove 30 is described.

Figure 6:
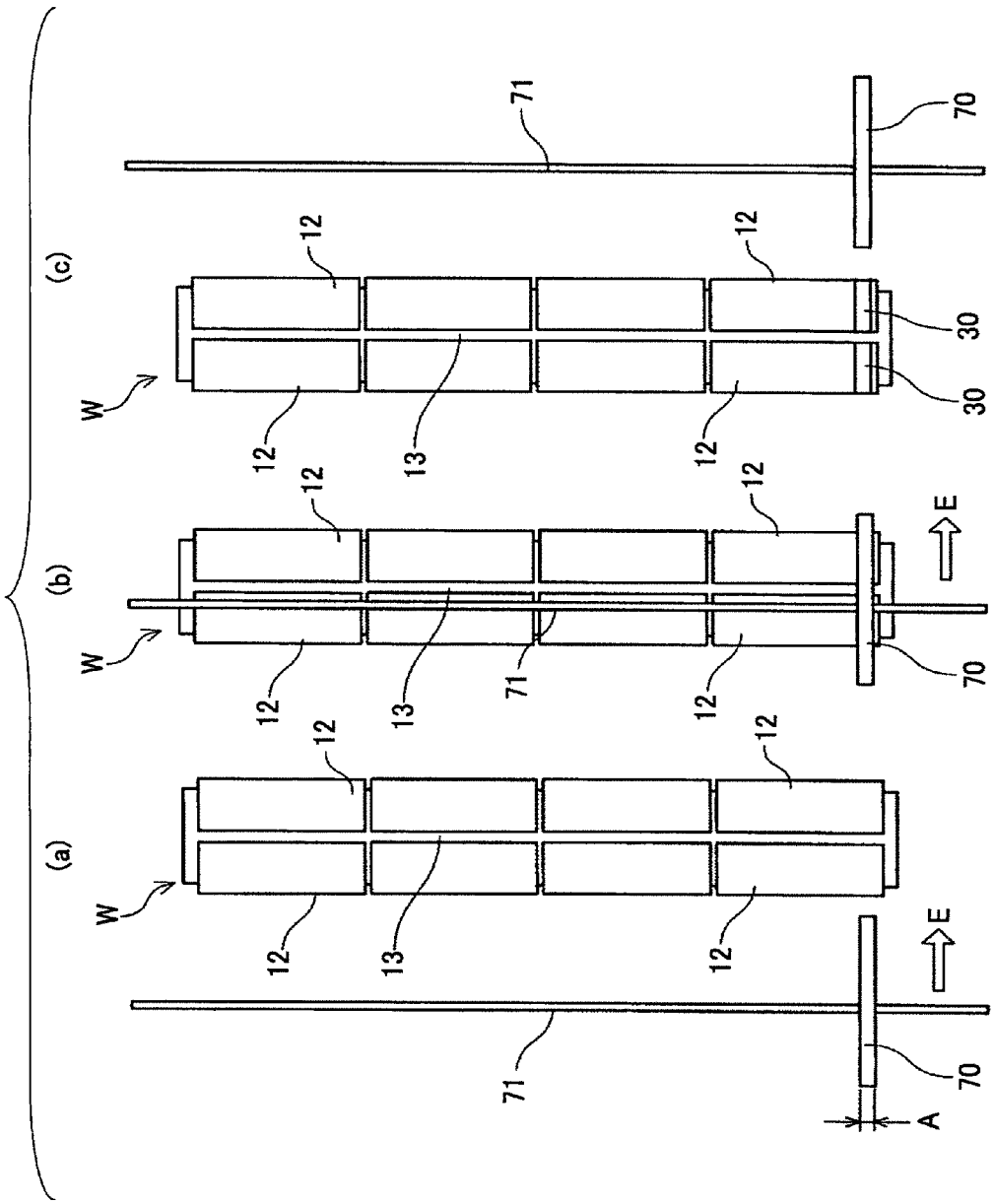
FIG. 6 is a plan view of a slit forming process of a first groove in a piezoelectric element member.
Figure 7:
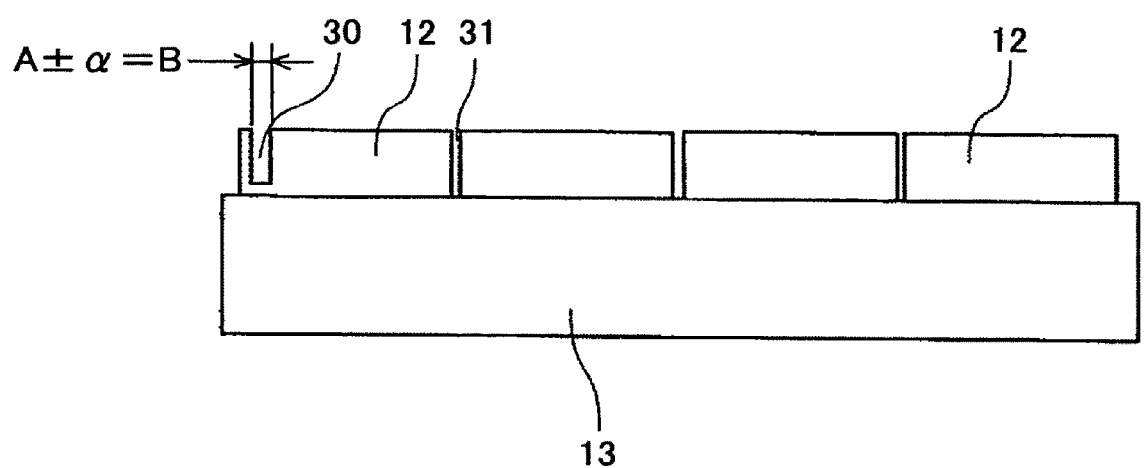
FIG. 7 is a side view of the slit forming process of the first groove in the piezoelectric element member.

First, referring to FIGS. 6 and 7, a first slit (groove) forming process is described. FIG. 6 is a plan view of the slit forming process of the first groove 30. FIG. 7 is a side view of the slit forming process of the first groove 30.

In the forming process of the first slit, for example, a dicer is used. The dicer forms slits on a work by rotating a rotary blade 70 fixed to a rotational shaft 71.

As shown in FIG. 6(a), a work W is fixed at a predetermined position on a table (not shown) in parallel to the rotational shaft 71. In the work W, two lines of the four piezoelectric element members 12 are adhered to the base member 13. Then the rotary blade 70 is disposed at a first groove forming position of the work W.

Next, as shown in FIG. 6(b), the rotary blade 70 is moved in the arrow E direction to pass through the work W by relatively moving the table or the rotational shaft 71. In the relatively moving, the table, or the rotational shaft 71, or both of them can be moved.

When the rotary blade 70 has passed through the work W, as shown in FIG. 6(c) and FIG. 7, a first groove 30 is formed in the piezoelectric element members 12 of the work W. The depth of the groove 30 can be formed with a predetermined dimension by precisely positioning the rotary blade 70 and the rotational shaft 71 relative to the work W. As shown in FIG. 7, when the width of the rotary blade 70 is A, the width B of the groove 30 is $A \pm \alpha$ ($B = A \pm \alpha$). The $\alpha$ is different among dicing conditions and is obtained beforehand.

Figure 8:
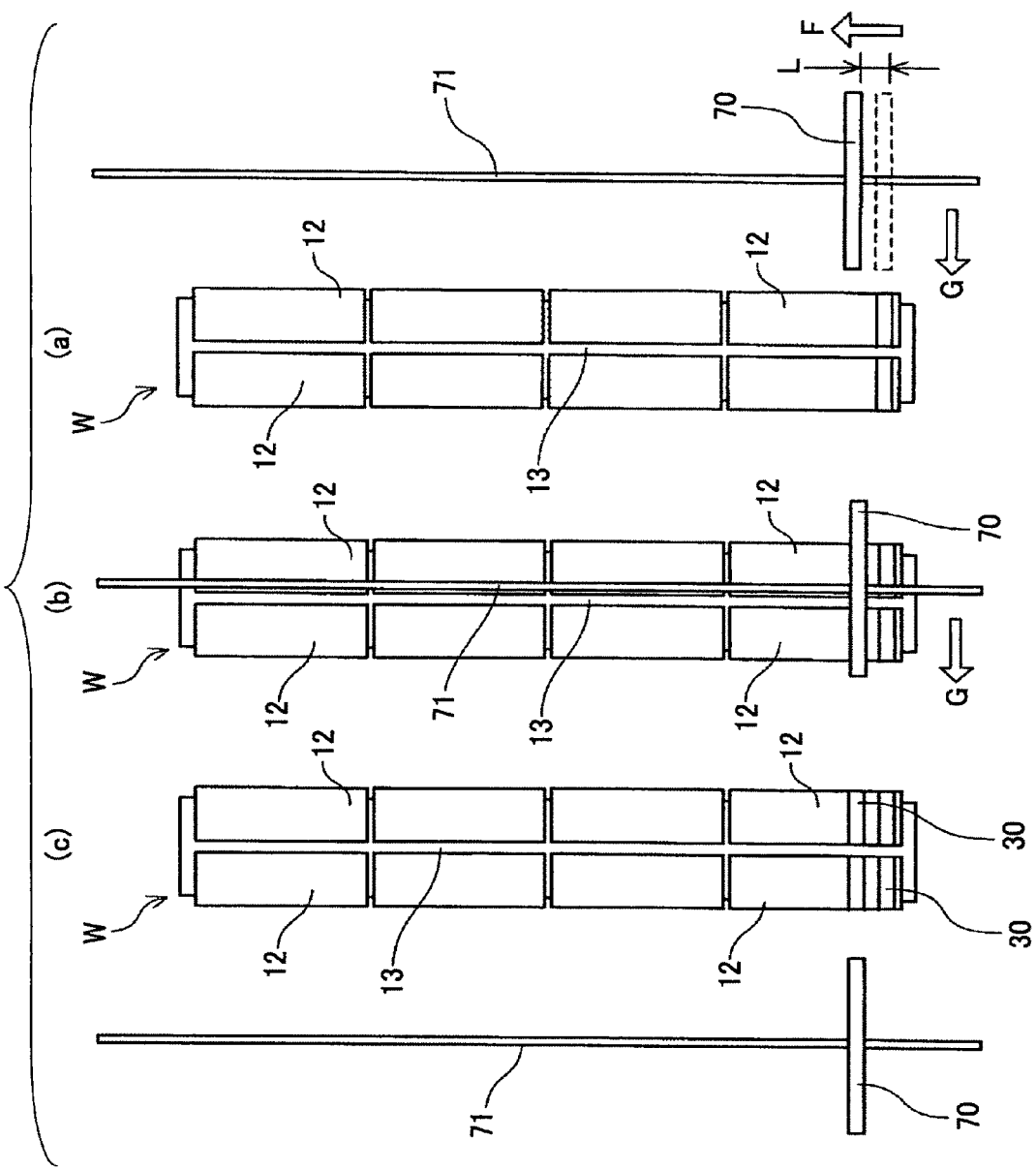
FIG. 8 is a plan view of a slit forming process of a second groove in the piezoelectric element member.
Figure 9:
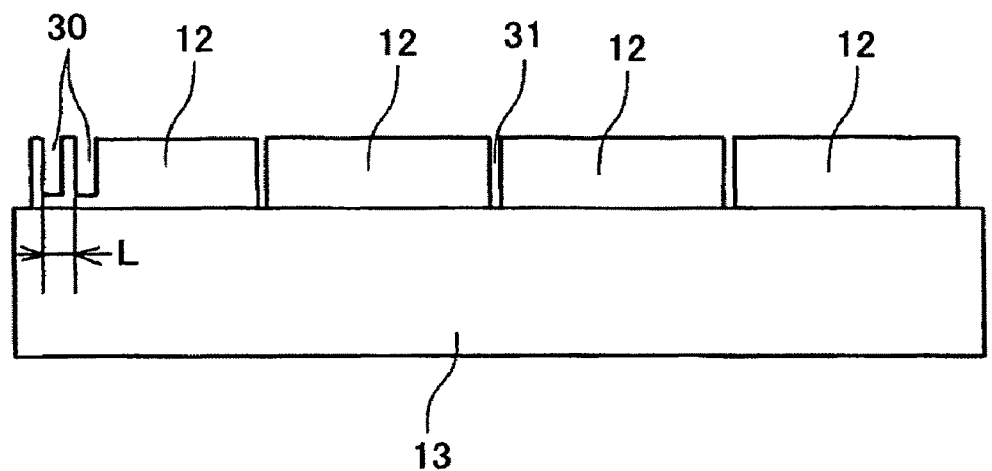
FIG. 9 is a side view of the slit forming process of the second groove in the piezoelectric element member.

Next, referring to FIGS. 8 and 9, a second slit (groove) forming process is described. FIG. 8 is a plan view of the slit forming process of the second groove. FIG. 9 is a side view of the slit forming process of the second groove. In FIG. 8, in order to easily compare processes with the processes shown in FIG. 6, the processes are shown from the right to the left.

As shown in FIG. 8(a), after the process shown in FIG. 6(c) in which the rotary blade 70 has passed through the work W, the table or the rotary blade 70 is moved in the arrow direction F by the length L. The length L is the sum of the width B of the groove 30 and the convex part C (the width) of the stacked type piezoelectric element 12a; that is, $L = B + C$.

Next, as shown in FIG. 8(b), the rotary blade 70 is moved in the arrow G direction (opposite to the arrow E direction) to pass through the work W by relatively moving the table or the rotational shaft 71.

When the rotary blade 70 has passed through the work W, as shown in FIG. 8(c) and FIG. 9, a second groove 30 is formed in the piezoelectric element members 12 of the work W.

Figure 10:
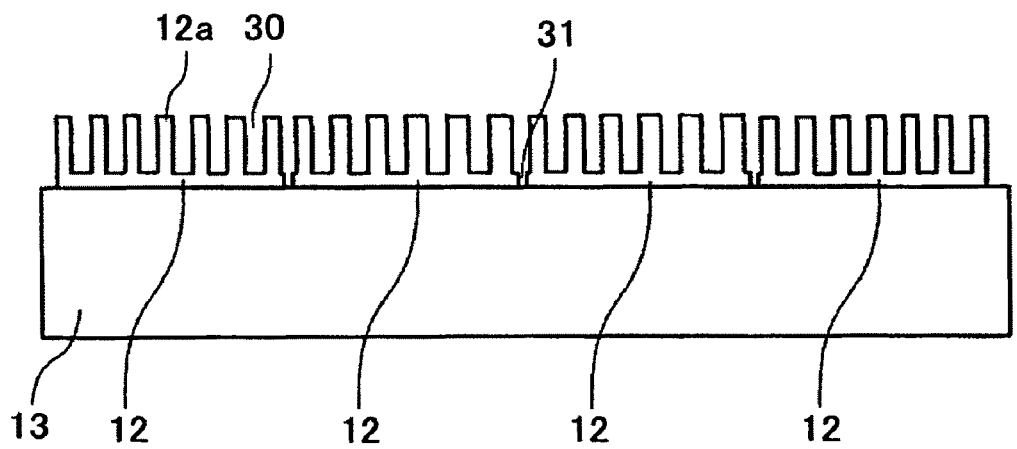
FIG. 10 is a side view in which all grooves are formed in all the piezoelectric element members.

When the above processes are repeated, that is, when the rotary blade 70 is reciprocated in the direction perpendicular to the long-length direction of the work W by moving the work W with a predetermined length, as shown in FIG. 10, all the grooves 30 are formed in all the piezoelectric element members 12. FIG. 10 is a side view in which all the grooves 30 are formed in all the piezoelectric element members 12. At this time, the ends of the piezoelectric element members 12 are positioned at the index 50, and the groove 30 is formed at the position where the two adjacent piezoelectric element members 12 are connected.

As described above, the piezoelectric actuator 20 having the long length can be easily obtained by arraying three or more piezoelectric element members 12 on the base member 13. That is, in order to form a groove 30 at the ends of the piezoelectric element members 12 adjacently positioned, the piezoelectric element members 12 adhered on the base member 13 are fixed on the table, and the groove 30 is formed in the piezoelectric element members 12. With this, at the connection position between the two adjacent piezoelectric element members 12, the groove (slit) 30 is formed.

As described above, since the index 50 showing the position of the groove 30 is formed at the position where the two adjacent piezoelectric element members 12 are connected, when the ends of the two adjacent piezoelectric element members 12 are positioned within the width of the index 50, the ends of the two adjacent piezoelectric element members 12 can be easily and surely positioned at the position where the groove 30 is formed.

Second Embodiment

Figure 11:
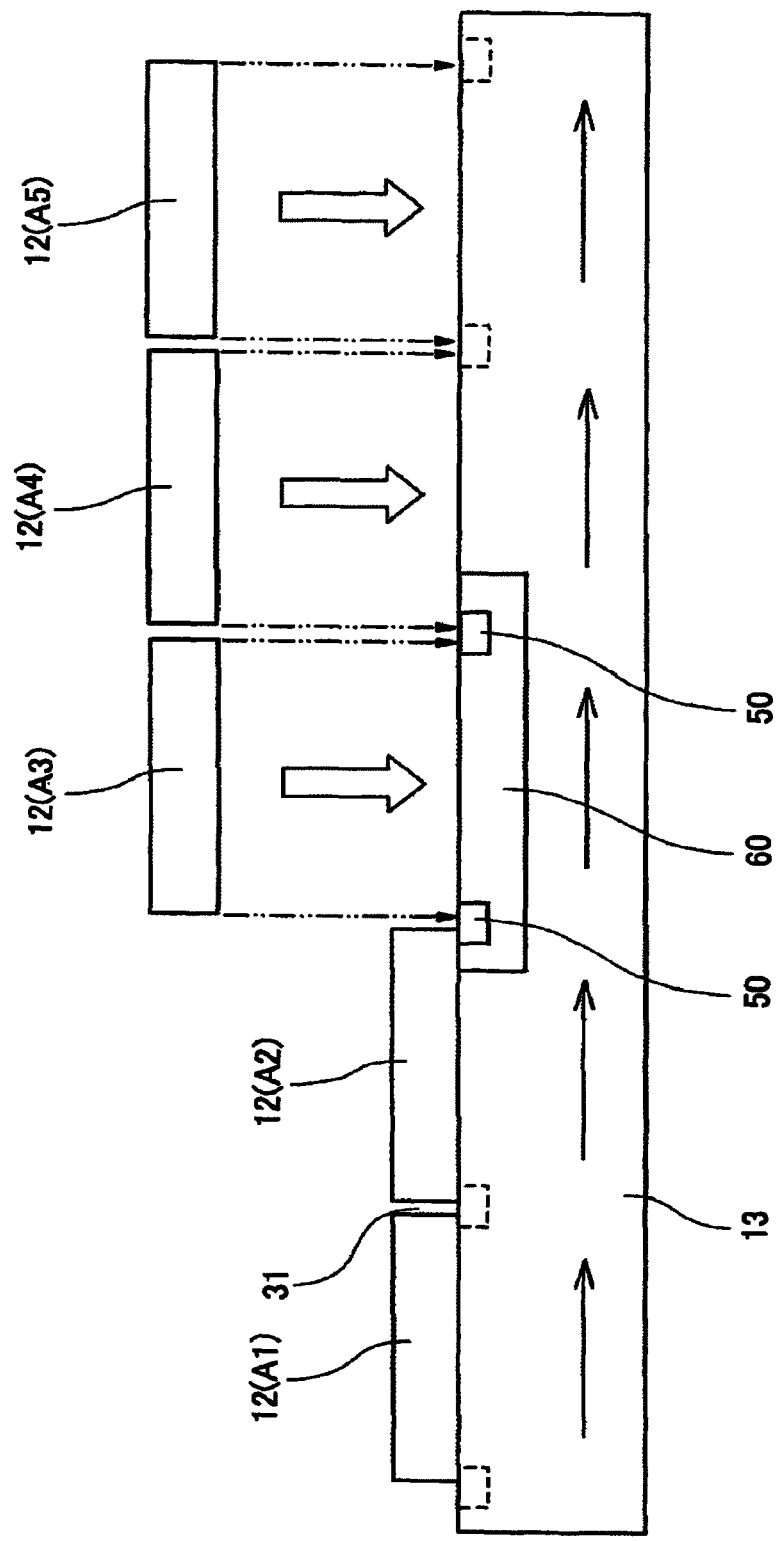
FIG. 11 is a cut-away side view showing a manufacturing method of the piezoelectric actuator according to a second embodiment of the present invention.

Next, referring to FIG. 11, a manufacturing method of the piezoelectric actuator 20 according to a second embodiment of the present invention is described. FIG. 11 is a cut-away side view showing the manufacturing method of the piezoelectric actuator 20 according to the second embodiment of the present invention.

In the second embodiment of the present invention, when the piezoelectric element members 12 are arrayed on the base member 13, a moving body 60 having two indexes 50 showing the width of the groove (slit) 30 is provided. The indexes 50 are disposed at the corresponding positions where the two adjacent piezoelectric element members 12 are connected.

The interval (pitch) between the two indexes 50 is determined to be the distance (B+C)×(n+1) between the centers of the concave parts of the indexes 50. The moving body 60 can be moved near the base member 13 in the arraying direction of the piezoelectric element members 12. The moving body 60 moves at a unit of the distance (B+C)×(n+1). As the moving body 60, a stage capable of measuring the moving amount in minimum 1 μm which is available in the market can be used.

Each time when the moving body 60 is moved in the unit of the distance (B+C)×(n+1), the piezoelectric element members 12 are disposed to match the indexes 50. In FIG. 11, from the left, a first piezoelectric element member 12(A1) and a second piezoelectric element member 12(A2) are arrayed in this order, and the moving body 60 is moved to the position where a third piezoelectric element member 12(A3) is arrayed. After arraying the third piezoelectric element member 12(A3), a fourth piezoelectric element member 12(A4) and a fifth piezoelectric element member 12(A5) are arrayed by moving the moving body 60 to the corresponding appropriate positions.

As described above, the indexes 50 showing the width of the groove (slit) 30 are provided in the moving body 60 which groove 30 is formed at the position where the two adjacent piezoelectric element members 12 are connected, and the piezoelectric element members 12 are arrayed by positioning the ends of the two adjacent piezoelectric element members 12 within the width of the indexes 50 while moving the moving body 60. With this, the two adjacent piezoelectric element members 12 can be arrayed so that the groove 30 is easily and surely formed at the ends where the two adjacent piezoelectric element members are connected.

Third Embodiment

Figure 12:
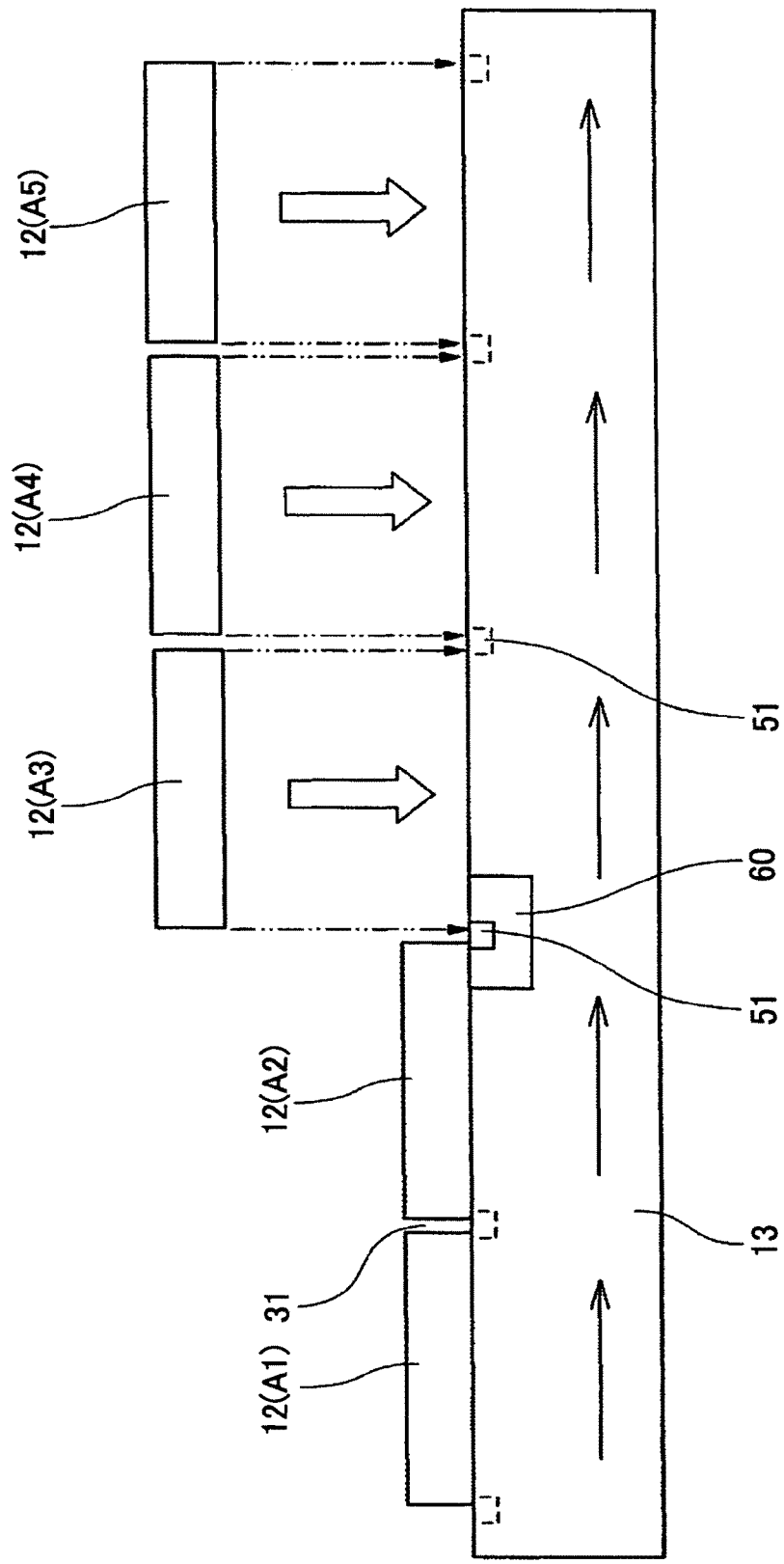
FIG. 12 is a cut-away side view showing a manufacturing method of the piezoelectric actuator according to a third embodiment of the present invention.

Next, referring to FIG. 12, a manufacturing method of the piezoelectric actuator 20 according to a third embodiment of the present invention is described. FIG. 12 is a cut-away side view showing the manufacturing method of the piezoelectric actuator 20 according to the third embodiment of the present invention.

In the third embodiment of the present invention, when the piezoelectric element members 12 are arrayed on the base member 13, a moving body 61 having one index 51 showing the width of the groove (slit) 30 is provided.

In this case, each time when the moving body 61 is moved in the unit of the distance (B+C)×(n+1), the ends of the piezoelectric element members 12 are disposed to match the index 51 so that the gap 31 is formed between the piezoelectric element members 12. With this, the piezoelectric element members 12(A1) through 12(A5) are sequentially arrayed.

Since both the ends of the piezoelectric element member 12 are not matched with the index 51, more precise positioning is required than that in the second embodiment of the present invention. Therefore, the width of the index 51 (convex part) must be smaller than the width B of the groove 30. It is preferable that the width of the index 51 be approximately ½ of the width B of the groove 30.

In the third embodiment of the present invention, since positioning is executed at one position, when an automatic manufacturing method is applied to the piezoelectric actuator 20, control can be simple.

Fourth Embodiment

Figure 13:
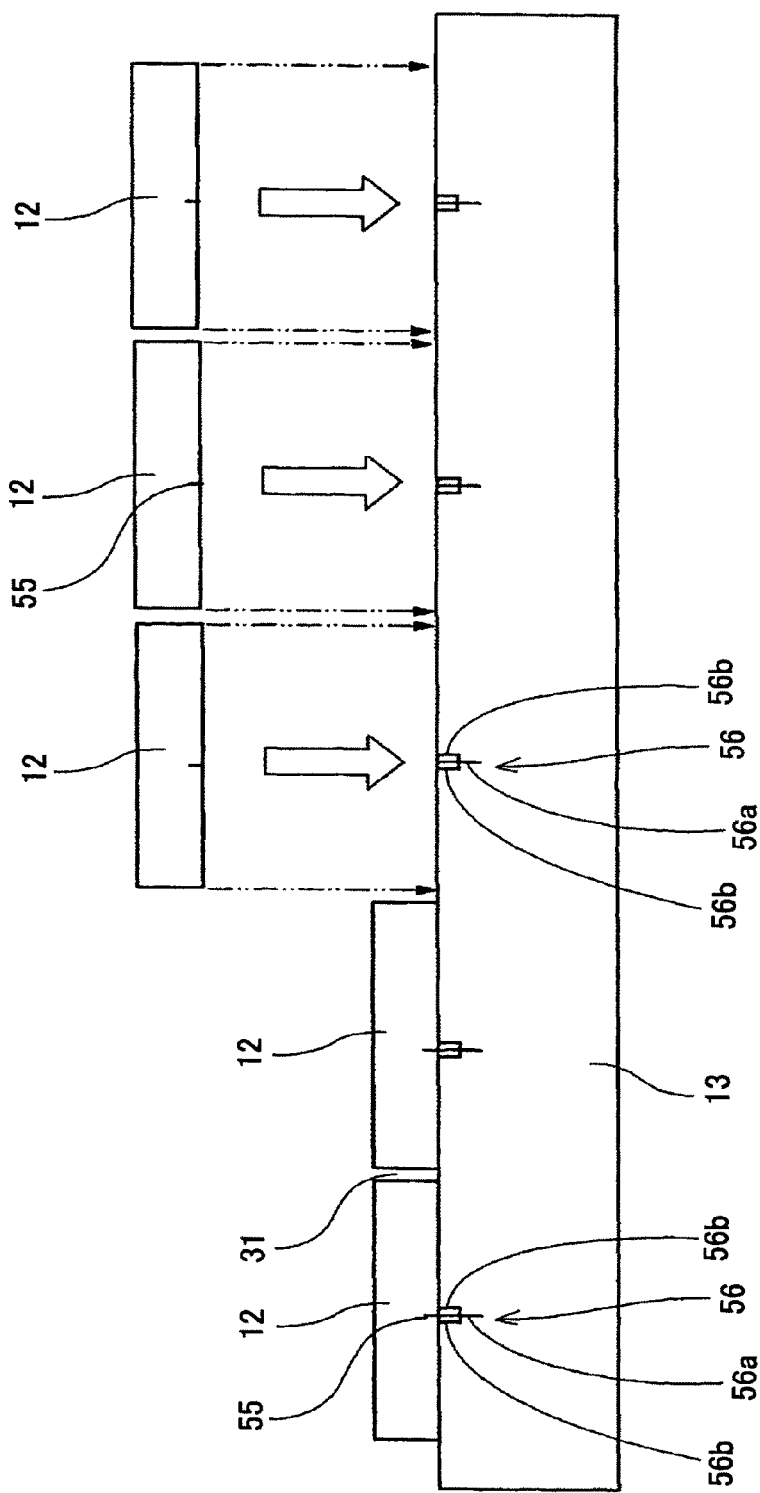
FIG. 13 is a cut-away side view showing a manufacturing method of the piezoelectric actuator according to a fourth embodiment of the present invention.

Next, referring to FIG. 13, a manufacturing method of the piezoelectric actuator 20 according to a fourth embodiment of the present invention is described. FIG. 13 is a cut-away side view showing the manufacturing method of the piezoelectric actuator 20 according to the fourth embodiment of the present invention.

In the fourth embodiment of the present invention, a first index 55 is formed at a center part of the piezoelectric element member 12 and a second index 56 is formed near or at the base member 13. The center part does not signify the middle of the piezoelectric element member 12. The piezoelectric element members 12 are arrayed so that the index 55 aligns with the index 56.

That is, the first index 55 having a line shape is formed at a predetermined position of the piezoelectric element member 12. The first index 55 can be formed by applying a precision mechanical process, or a precision photo printing process to the piezoelectric element member 12. The second index 56 formed on the base member 13 which index 56 includes a long line 56a and short lines 56b showing an allowable range. Similar to the index 50, the interval (pitch) between the long lines 56a of the second indexes 56 is the distance (B+C)×(n+1). The second index 56 does not need to be directly formed on the base member 13. That is, the second index 56 can be formed on a member and the member is disposed near the base member 13 when the piezoelectric element members 12 are arrayed.

The piezoelectric element member 12 is disposed on the base member 13 so that the first index 55 preferably aligns with the long line 56a and between the short lines 56b.

As described above, the first index 55 is formed on the piezoelectric element member 12 and the second index 56 is formed on the member different from the piezoelectric element member 12 so that the end of the piezoelectric element member 12 is disposed at a position where the groove 30 is formed when the piezoelectric element members 12 are arrayed. When the piezoelectric element members 12 are arrayed while aligning the first index 55 with the second index 56, the ends of the two adjacent piezoelectric element members 12 can be easily and surely arrayed so that the groove 30 is formed at the ends of the two adjacent piezoelectric element members 12.

Fifth Embodiment

Figure 14:
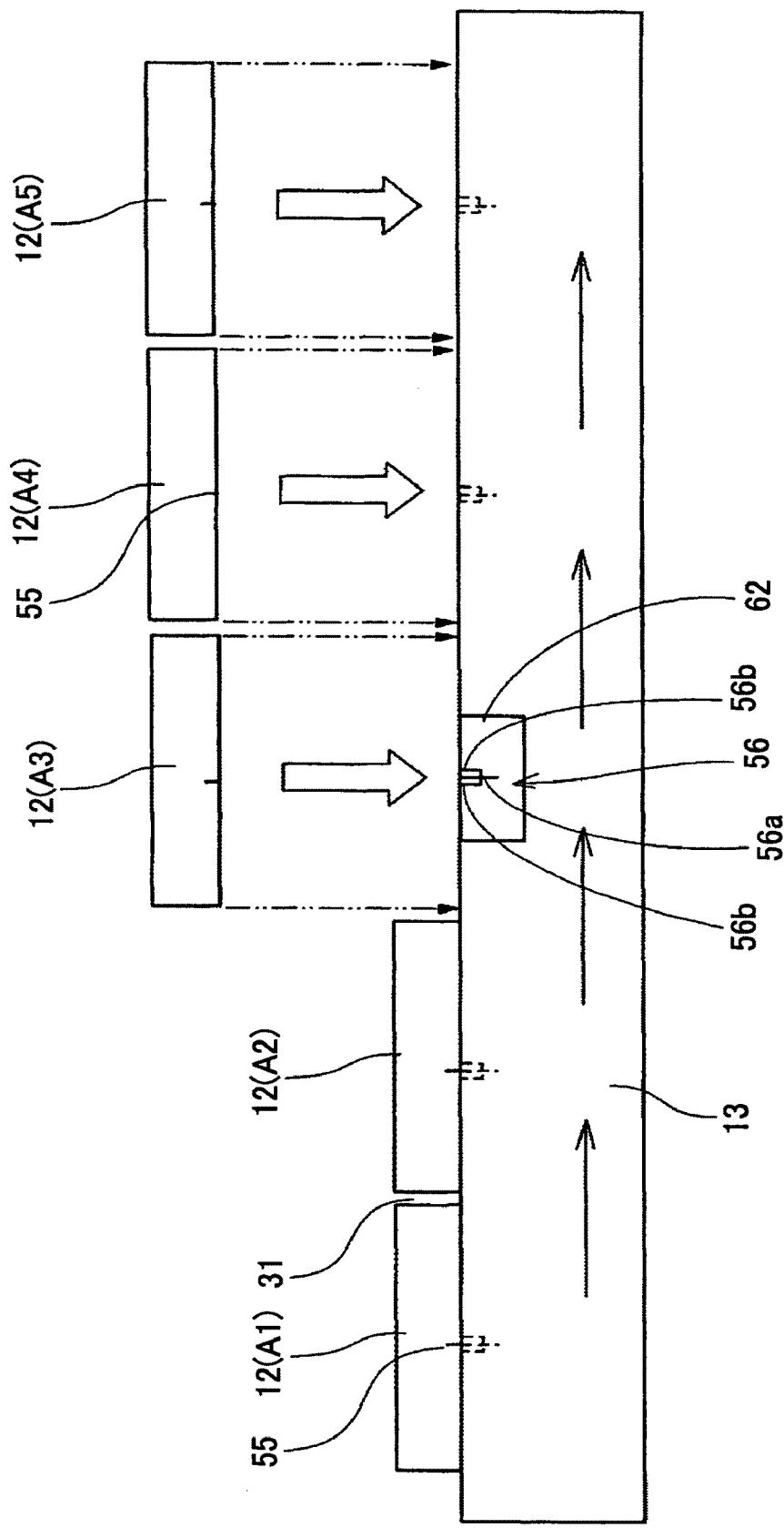
FIG. 14 is a cut-away side view showing a manufacturing method of the piezoelectric actuator 20 according to a fifth embodiment of the present invention.

Next, referring to FIG. 14, a manufacturing method of the piezoelectric actuator 20 according to a fifth embodiment of the present invention is described. FIG. 14 is a cut-away side view showing the manufacturing method of the piezoelectric actuator 20 according to the fifth embodiment of the present invention.

In the fifth embodiment of the present invention, a moving body 62 having the second index 56 which is used in the fourth embodiment of the preset invention is provided. When the moving body 62 is moved in the unit of the distance (B+C)×(n+1) and the piezoelectric element members 12(A1) through 12(A5) are sequentially arrayed on the base member 13, the piezoelectric element members 12 can be arrayed so that the groove 30 is formed at the connection part where the two adjacent piezoelectric element members 12 are connected.

Figure 15:
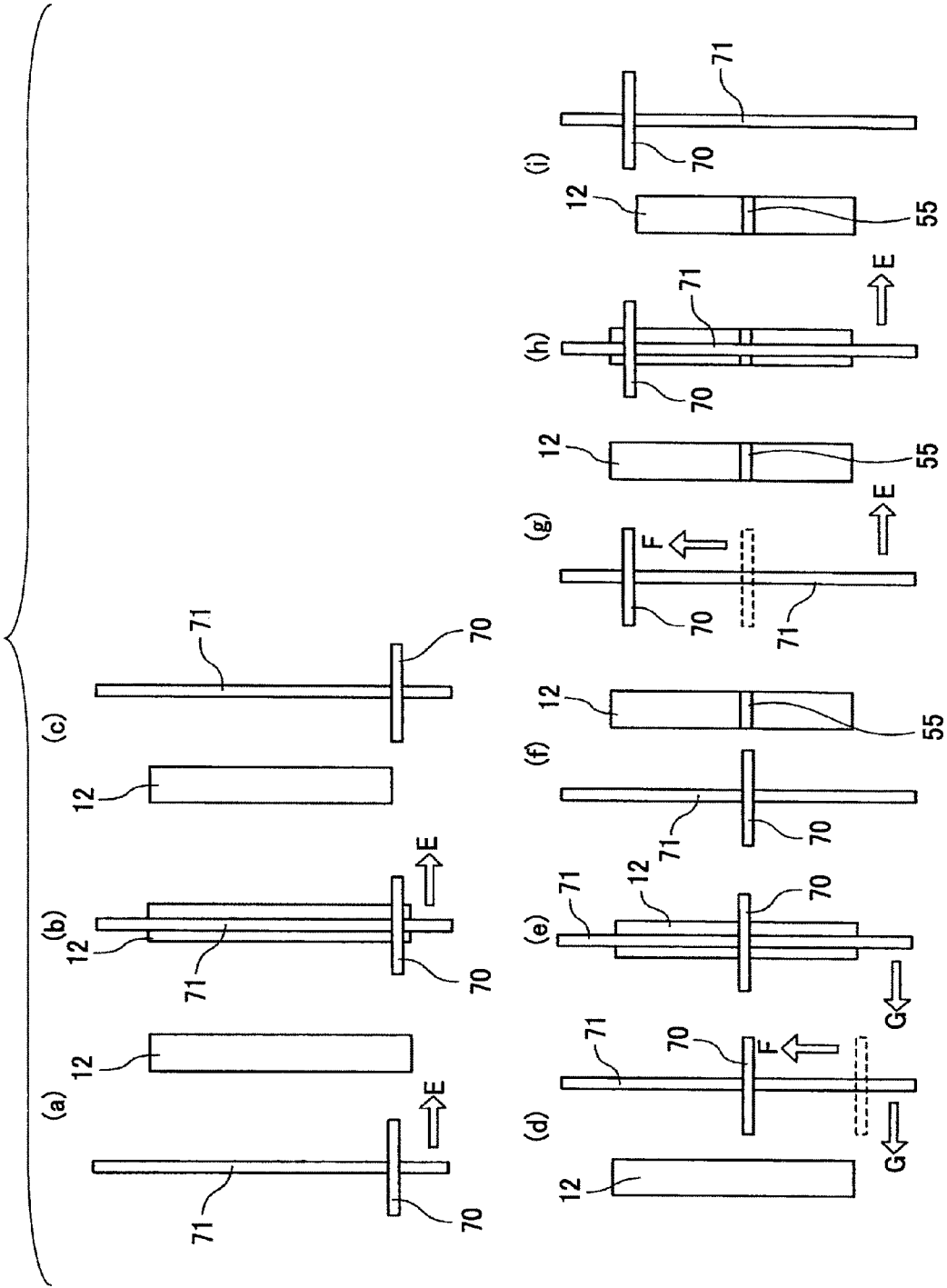
FIG. 15 is a plan view showing a forming method of a first index and a processing method to cut the piezoelectric element member into a predetermined length.

Next, referring to FIG. 15, a forming method of the first index 55 on the piezoelectric element member 12 and a processing method to cut the piezoelectric element member 12 into a predetermined length are described. As described in the fourth and the fifth embodiments, the first index 55 is formed at the center part (not the middle) of the piezoelectric element member 12.

In this, as described above, the dicer having the rotary blade 70 which is rotated by the rotational shaft 71 is used.

FIG. 15 is a plan view showing the forming method of the first index 55 and the processing method to cut the piezoelectric element member 12 into a predetermined length.

As shown in FIG. 15(a), the piezoelectric element member 12 is fixed at a predetermined position on a table (not shown) in parallel to the rotational shaft 71. At this time, the tip of the rotary blade 70 is positioned under the thickness of the piezoelectric element member 12.

Next, as shown in FIG. 15(b), the rotary blade 70 is moved in the arrow E direction to pass through the piezoelectric element member 12 by relatively moving the table or the rotational shaft 71. When the rotary blade 70 has passed through the piezoelectric element member 12, as shown in FIG. 15(c), one end of the piezoelectric element member 12 is cut off.

Next, as shown in FIG. 15(d), the rotary blade 70 is moved in the direction F is moved (or the table is relatively moved) by a predetermined distance and the tip of the rotary blade 70 is moved to a height so that the tip is slightly cut into the upper surface of the piezoelectric element member 12.

Next, as shown in FIG. 15(e), the rotary blade 70 is moved in the direction G to pass through the upper surface of the piezoelectric element member 12 by moving the table or the rotational shaft 71. When the rotary blade 70 has passed through the upper surface of the piezoelectric element member 12, as shown in FIG. 15(f), the first index 55 which is a groove is formed at a predetermined position in the piezoelectric element member 12.

Next, as shown in FIG. 15(g), the rotary blade 70 is moved (or the table is relatively moved) to a position in the direction F by a predetermined distance (at the position by distance (B+C)×(n+1) from the position shown in FIG. 15(a)). Then, the height of the rotary blade 70 is returned to the same height as that shown in FIG. 15(a).

Next, as shown in FIG. 15(h), the rotary blade 70 is moved in the arrow E direction to pass through the piezoelectric element member 12 by relatively moving the table or the rotational shaft 71. When the rotary blade 70 has passed through the piezoelectric element member 12, as shown in FIG. 15(i), the other end of the piezoelectric element member 12 is cut off.

BY the above sequential processes, the length of the piezoelectric element member 12 can be precisely determined and the first index 55 can be formed. When the first index 55 is not needed, the processes forming the first index 55 are omitted.

Sixth Embodiment

Figure 16:
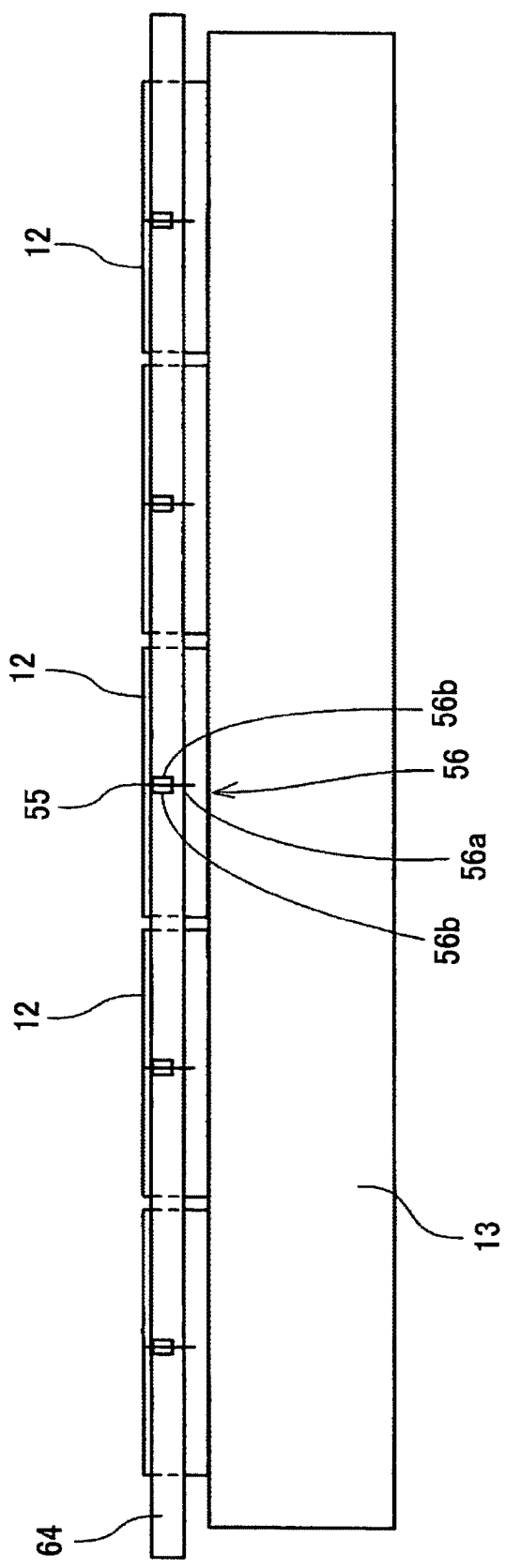
FIG. 16 is a first cut-away side view showing a manufacturing method of the piezoelectric actuator according to a sixth embodiment of the present invention.
Figure 17:
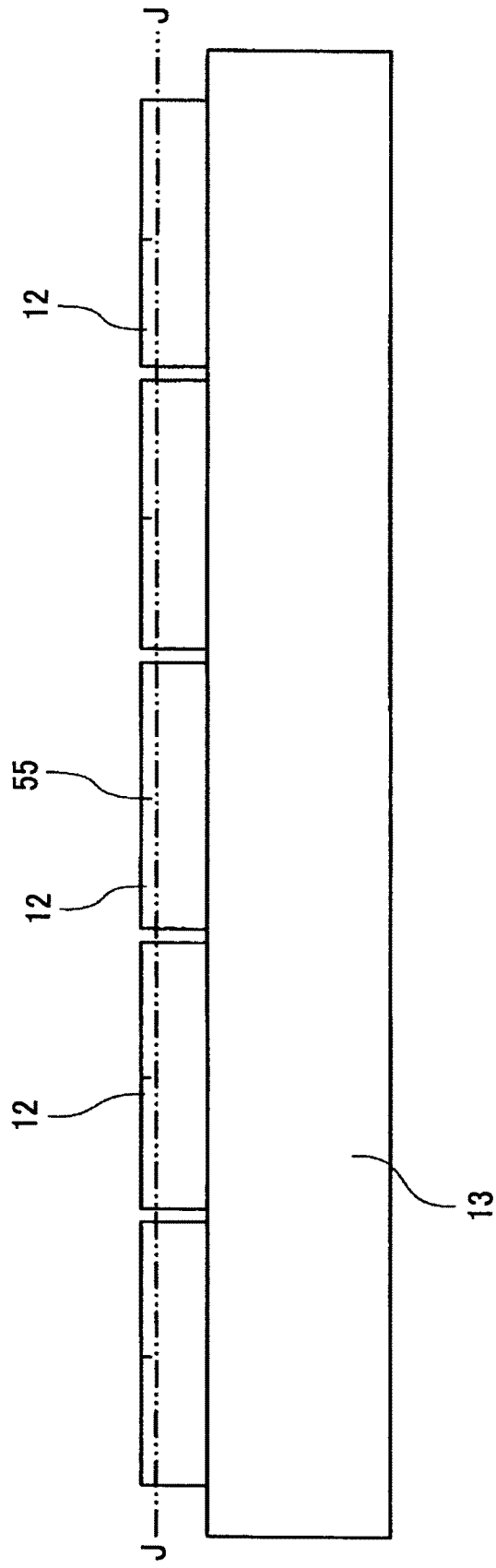
FIG. 17 is a second cut-away side view showing the manufacturing method of the piezoelectric actuator according to the sixth embodiment of the present invention.

Next, referring to FIGS. 16 and 17, a manufacturing method of the piezoelectric actuator 20 according to a sixth embodiment of the present invention is described. FIG. 16 is a first cut-away side view showing the manufacturing method of the piezoelectric actuator 20 according to the sixth embodiment of the present invention. FIG. 17 is a second cut-away side view showing the manufacturing method of the piezoelectric actuator 20 according to the sixth embodiment of the present invention.

In the sixth embodiment of the present invention, the first index 55 having a line shape is formed at a predetermined position on the piezoelectric element member 12 and a scale (ruler) 64 on which the second index 56 is formed is disposed near the base member 13. As described above, the second index 56 includes the long line 56a and the short lines 56b showing the allowable range. In addition, similar to the interval between the indexes 50, the interval (pitch) between the long lines 56a is the distance (B+C)×(n+1).

As described in the fourth embodiment of the present invention, in the sixth embodiment of the present invention, as shown in FIG. 16, the piezoelectric element members 12 are arrayed on the base member 13 so that the first index 55 preferably aligns with the long line 56a and between the short lines 56b.

Next, as shown in FIG. 17, after adhering the piezoelectric element members 12 to the base member 13, the upper surface parts of the piezoelectric element members 12 are ground to a cut line under the first indexes 55 along a two-dot chain line J-J by applying surface grinding. With this, the first indexes 55 are removed from the piezoelectric element members 12.

When the piezoelectric element members 12 are adhered to the base member 13, the upper surfaces of the piezoelectric element members 12 opposite to face the base member 13 are not always flat due to the non-uniformity of the adhesive thickness and the thickness non-preciseness of the piezoelectric element members 12. When the displacement of the stacked type piezoelectric element 12a in the piezoelectric actuator 20 is utilized, the flatness of the surface of the stacked type piezoelectric element 12a is required. Therefore, the upper surfaces of the piezoelectric element members 12 are ground to form the flatness. When the upper surfaces of the piezoelectric element members 12 are ground, the surface grinding is applied to the depth where the first indexes 55 are formed and the flatness of the upper surfaces of the piezoelectric element members 12 can be obtained by removing the first indexes 55. When the first index 55 is formed of a groove, the first index 55 can be removed by the surface grinding without applying a specific process.

Seventh Embodiment

Figure 18:
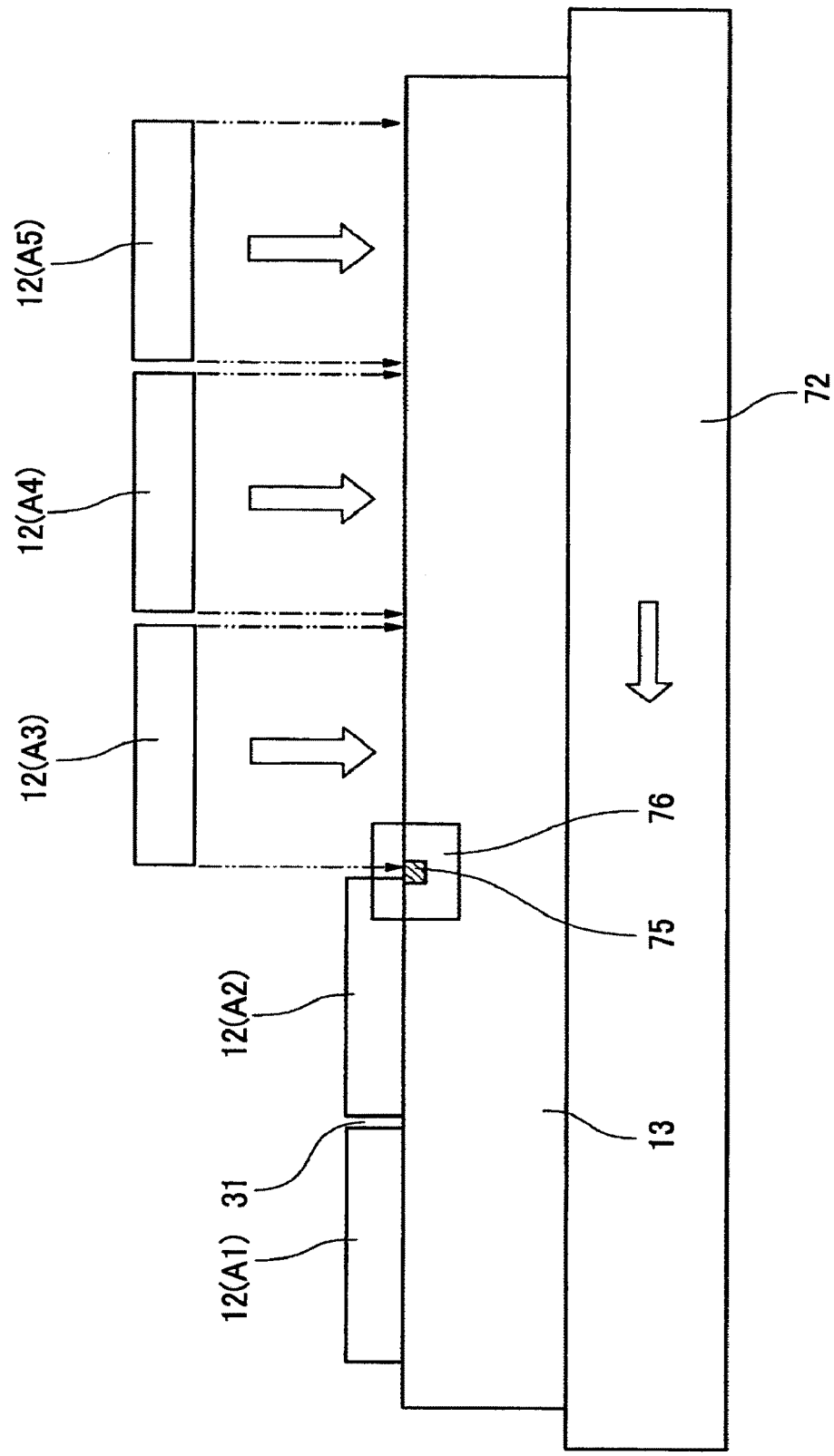
FIG. 18 is a cut-away side view showing a manufacturing method of the piezoelectric actuator according to a seventh embodiment of the present invention.

Next, referring to FIG. 18, a manufacturing method of the piezoelectric actuator 20 according to a seventh embodiment of the present invention is described. FIG. 18 is a cut-away side view showing the manufacturing method of the piezoelectric actuator 20 according to the seventh embodiment of the present invention.

In the seventh embodiment of the present invention, the base member 13 is disposed on a stage 72 which can precisely move an object thereon in the X-Y directions. In addition, an index 75 corresponding to a position of the interval between the two adjacent piezoelectric element members 12 is formed on an imaging area 76 of an image taking unit, for example, a camera which takes an image of the base member 13 and so on.

After disposing the one piezoelectric element member 12 on the base member 13, the base member 13 is moved in the arrow direction by moving the stage 72, and the piezoelectric element member 12 is fixed at a position where the index 75 in the imaging area 76 is aligned with the position of the interval while the ends of the two adjacent piezoelectric element members 12 are taken by the image taking unit. Further, the base member 13 is moved in the arrow direction by moving the stage 72, and the next piezoelectric element member 12 is fixed at a position where the index 75 in the imaging area 76 is aligned with the position of the interval. When the above is continued, the piezoelectric element members 12(A1) through 12(A5) are fixed on the base member 13.

By the above processes, when one end of the first piezoelectric element member 12 and the other end of the second piezoelectric element member 12 are positioned within the index 75, the end of each piezoelectric element member 12 can be disposed at a position where the groove 30 is formed.

As described above, when the base member 13 is moved so that the index 75 is aligned with the position of the interval of the two adjacent piezoelectric element members 12, the piezoelectric element members 12 can be easily arrayed on the base member 13. With this, the end of each piezoelectric element member 12 can be disposed at a position where the groove 30 is formed.

Eighth Embodiment

Figure 19:
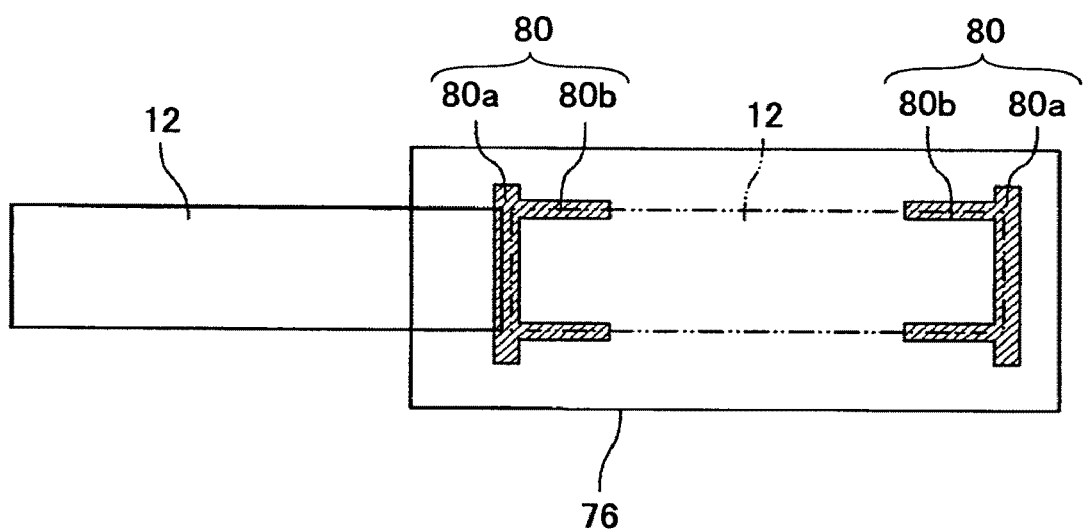
FIG. 19 is a cut-away side view showing a manufacturing method of the piezoelectric actuator according to an eighth embodiment of the present invention.

Next, referring to FIG. 19, a manufacturing method of the piezoelectric actuator 20 according to an eighth embodiment of the present invention is described. FIG. 19 is a cut-away side view showing the manufacturing method of the piezoelectric actuator 20 according to the eighth embodiment of the present invention. In FIG. 19, only the piezoelectric element member 12 and the imaging area 76 are shown.

In the eighth embodiment of the present invention, in the imaging area 76 described in the seventh embodiment of the present invention, two indexes 80 are disposed. The index 80 includes an index 80a and two indexes 80b. The index 80a is disposed at a position where the ends of the two adjacent piezoelectric element members 12 are connected and the indexes 80b are disposed perpendicular to the index 80a.

As shown in FIG. 19, the piezoelectric element member 12 is fixed on the base member 13 so that both the ends of the piezoelectric element member 12 are aligned with the corresponding indexes 80a and both the upper and lower side ends of the piezoelectric element member 12 are aligned with the corresponding indexes 80b. After fixing the first piezoelectric element member 12 on the base member 13, the second piezoelectric element member 12 is fixed on the base member 13 by using the above processes, and the processes are continued until all the piezoelectric element members 12 are fixed on the base member 13.

The groove forming positions at the connection positions where the two adjacent piezoelectric element members 12 are connected are determined by the indexes 80a, and the upper and lower positions of the piezoelectric element member 12 are determined by the indexes 80b. Therefore, precise positioning of the piezoelectric element members 12 can be obtained in both the arraying direction and the direction perpendicular to the arraying direction of the piezoelectric element members 12.

As described above, the piezoelectric element members 12 are arrayed on the base member 13 by using the indexes 80 which determine the arraying direction and the direction perpendicular to the arraying direction of the piezoelectric element members 12 while moving the base member 13. With this, the piezoelectric element members 12 can be precisely arrayed on the base member 13 so that the groove 30 can be formed at the position connecting the two adjacent piezoelectric element members 12.

The shape of the index 80 is not limited to the above shape and can be any shape which can be used in alignment. In addition, when the base member 13 and the piezoelectric element member 12 are taken by an image taking unit, an index can be disposed in the taken image and the index can be displayed on a screen. Further, without using an index, both the ends of the piezoelectric element member 12 are detected by taking the images thereof, and the fixing position of the piezoelectric element member 12 can be determined by a figure or a value based on the detection.

Ninth Embodiment

Figure 20:
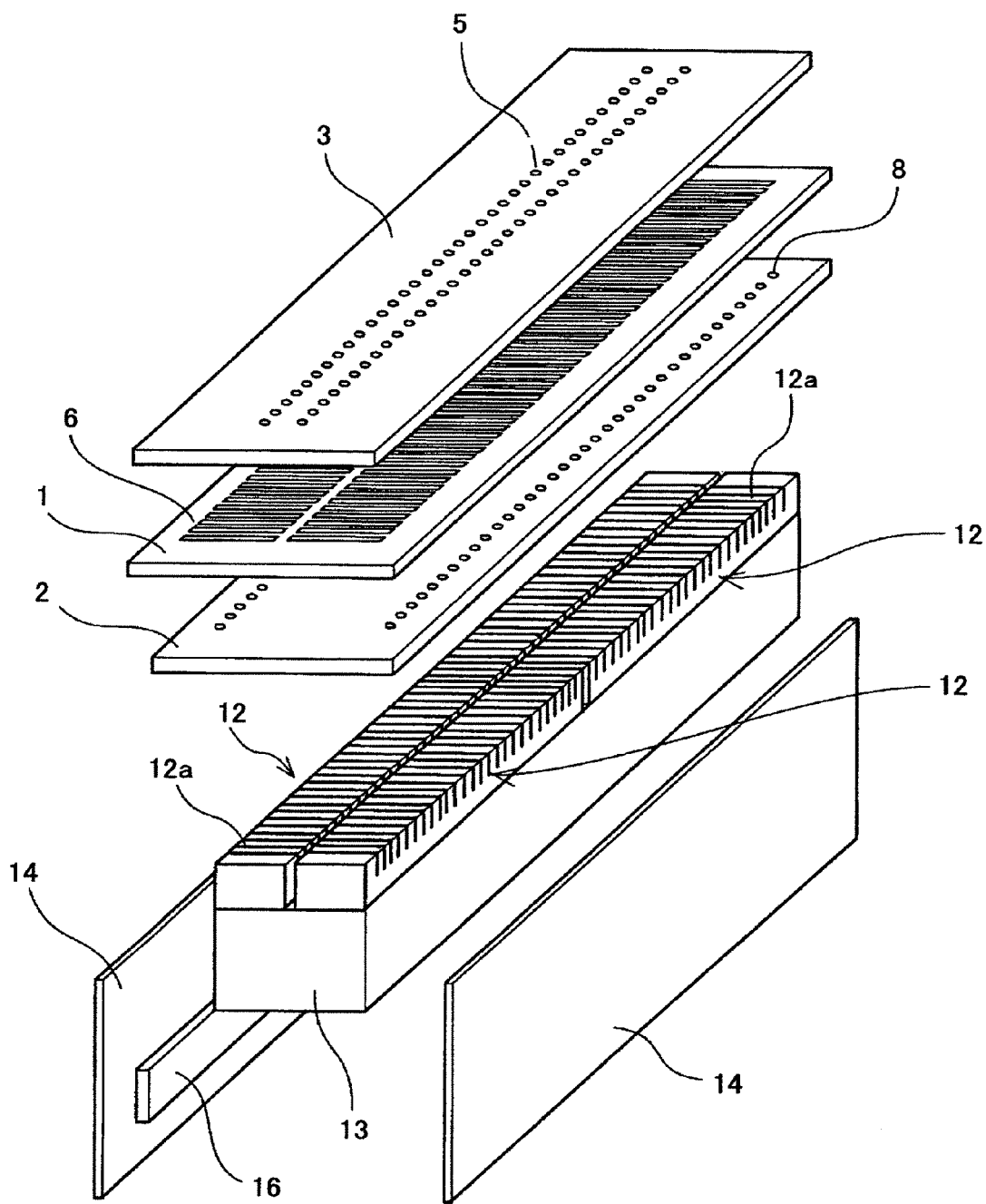
FIG. 20 is an exploded perspective view of a liquid ejecting head according to a ninth embodiment of the present invention.
Figure 21:
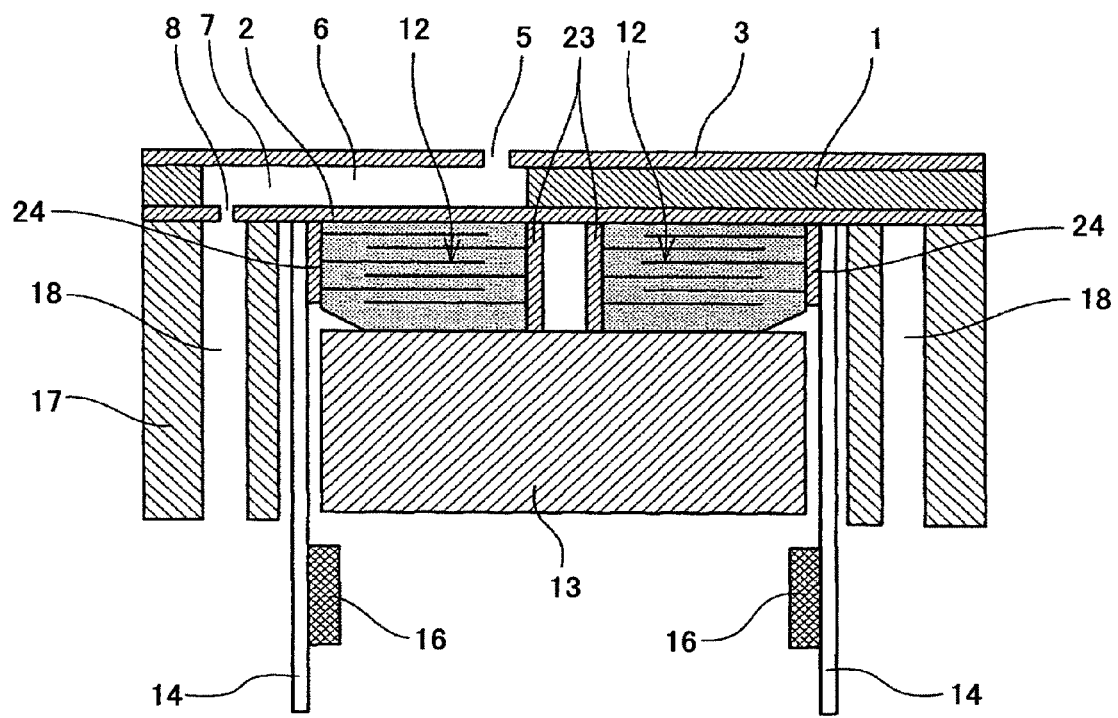
FIG. 21 is a cut-away side view of a part of the liquid ejecting head shown in FIG. 20 in the short-length direction of the liquid ejecting head shown in FIG. 20.

Next, referring to FIGS. 20 and 21, a ninth embodiment of the present invention is described. FIG. 20 is an exploded perspective view of a liquid ejecting head according to the ninth embodiment of the present invention. FIG. 21 is a cut-away side view of a part of the liquid ejecting head shown in FIG. 20 in the short-length direction of the liquid ejecting head. In the ninth embodiment of the present invention, the liquid ejecting head is an inkjet head.

In the ninth to seventeenth embodiments, in some elements, the reference number is different from that in the first to the eighth embodiments.

The liquid ejecting head includes a liquid chamber base plate 1 (liquid flowing route base plate 1) formed of SUS, a vibration plate 2 adhered to the lower surface of the liquid flowing route base plate 1, and a nozzle plate 3 adhered to the upper surface of the liquid flowing route base plate 1. By the liquid flowing route base plate 1, the vibration plate 2, and the nozzle plate 3; a pressure applying liquid chamber 6 connecting to a nozzle 5 from which ink droplets (liquid) are ejected, and a fluid resistance section 7 also operating as a supplying route of recording liquid (ink) to the pressure applying liquid chamber 6 are formed. In some cases, the pressure applying liquid chamber 6 is referred to as a liquid chamber, a pressure chamber, or a pressure applying chamber.

Cavities such as the pressure applying liquid chamber 6 and the fluid resistance section 7 are formed by etching a SUS base plate with a use of an acid etching liquid or by applying a mechanical punching process.

The vibration plate 2 is formed of a metal plate, for example, a nickel plate; however, the vibration plate 2 can be formed of a resin material or a material in which a resin material and a metal material are stacked.

In the nozzle plate 3, the nozzles 5 having a 10 to 30 μm diameter are formed corresponding to the pressure applying liquid chambers 6. The nozzle plate 3 is adhered to the liquid chamber base plate 1. The nozzle plate 3 can be formed of a metal plate, for example, a stainless steel plate, or a nickel plate; a resin film, for example, a polyimide film; a silicon plate; or a material combined the above. In addition, on the liquid ejecting surface of the nozzle plate 3, in order to form liquid repellency, a repellent film is formed by a well-known process such as a plating process and a repellent material coating process.

On the lower surface of the vibration plate 2 (on the surface opposite to face the pressure applying liquid chamber 6), stacked type piezoelectric elements 12a (pressure generating units) are adhered to the corresponding pressure applying liquid chambers 6 (pressure applying chambers). In the present embodiment, a piezoelectric actuator, which deforms the vibration plate 2 as a movable member, is formed of the piezoelectric element members 12 (the stacked type piezoelectric element members 12a) and a base member 13.

In the liquid ejecting head, the plural stacked type piezoelectric elements 12a are formed by a slitting process (grooving process) without being separated from each other. The piezoelectric element member 12 includes plural stacked type piezoelectric elements 12a. The plural piezoelectric element members 12 are arrayed in the long, length direction of the liquid ejecting head. In this case, the plural piezoelectric element members 12 are adhered on a surface (surface opposite to facing the vibration plate 2) of the base member 13 and a grooving process (slitting process) is applied to the piezoelectric element members 12. With this, the plural stacked type piezoelectric elements 12a are formed in the piezoelectric element member 12. In addition, a FPC (flexible printed circuit) cable 14 is connected to one end of the piezoelectric element member 12 for applying a driving waveform to each stacked type piezoelectric element 12a.

In addition, in the piezoelectric direction of the stacked type piezoelectric element 12a, pressure can be applied to liquid in the pressure applying liquid chamber 6 by using displacement in the d33 direction or in the d31 direction. In the present embodiment, the displacement in the d33 is used.

The base member 13 is preferable to be formed of a metal material. When the base member 13 is formed of a metal material, heat accumulation caused by self-heating of the stacked type piezoelectric element 12a (the piezoelectric element member 12) can be prevented. The piezoelectric element member 12 is adhered to the base member 13 by an adhesive; however, when the number of channels (the number of the pressure applying liquid chambers 6) becomes large, temperature rises to approximately 100° C. by the self-heating of the piezoelectric element member 12, and the adhesive strength is remarkably lowered. In addition, when temperature in the liquid ejecting head rises by the self-heating, ink (liquid) temperature rises. When the ink temperature rises, the viscosity of the ink is decreased and the ink ejecting characteristic is lowered. Therefore, by forming the base member 13 of a metal material, the heat accumulation caused by the self-heating of the stacked type piezoelectric element 12a is prevented, and lowering the ink ejecting characteristic caused by the low adhesive strength and the low ink viscosity can be prevented.

In addition, when the linear expansion coefficient of the base member 13 is large, an adhesive may be peeled off at the boundary between the base member 13 and the piezoelectric element member 12 at high temperature or low temperature. Conventionally, the length of the liquid ejecting head is not long; therefore, peeling of the piezoelectric element member 12 from the base member 13 caused by a temperature change (environmental change) may not occur. However, when the piezoelectric element members 12 of a 30 to 40 mm length having approximately 400 nozzles at 300 dpi are used, peeling off at the boundary between the base member 13 and the piezoelectric element member 12 remarkably occurs.

Therefore, it is preferable that the base member 13 be formed of a material whose linear expansion coefficient is 10E-6/° C. or less. When the material having the above linear expansion coefficient is used, peeling off of the piezoelectric element member 12 from the base member 13 at the boundary caused by a temperature difference due to an environmental change can be prevented. Especially, when the linear expansion coefficient of the base member 13 which is adhered to the piezoelectric element member 12 is 10E-6/° C. or less, peeling off at the boundary between the piezoelectric element member 12 and base member 13 can be remarkably prevented.

In addition, plural driver ICs 16 for applying a driving waveform (electric signal) to each pressure applying liquid chamber 6 (each channel) are provided on the FPC cable 14. Since the plural driver ICs are provided in the FPC cable 14, the electric signal can be generated at each driver IC, and the dispersion of the displacement characteristics in the channels of the stacked type piezoelectric elements 12a can be easily corrected.

In addition, a frame member 17 is adhered to the rim bottom surface of the vibration plate 2. In the frame member 17, common liquid chambers 18 for supplying ink to the pressure applying liquid chambers 6 are formed. The common liquid chambers 18 are formed to sandwich at least the driver ICs 16 and the base member 13. The common liquid chamber 18 is connected to the fluid resistance section 7 and the pressure applying liquid chamber 6 via a through hole 8 formed in the vibration plate 2.

Figure 22:
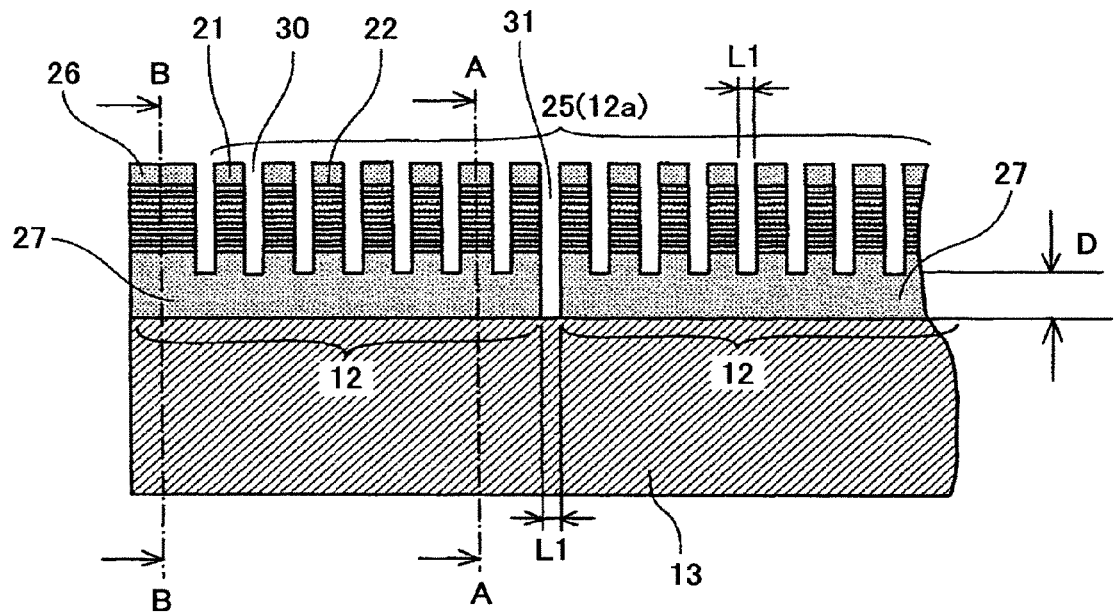
FIG. 22 is a cut-away side view of a part of the liquid ejecting head in the long-length direction of the liquid ejecting head shown in FIG. 20.
Figure 23:
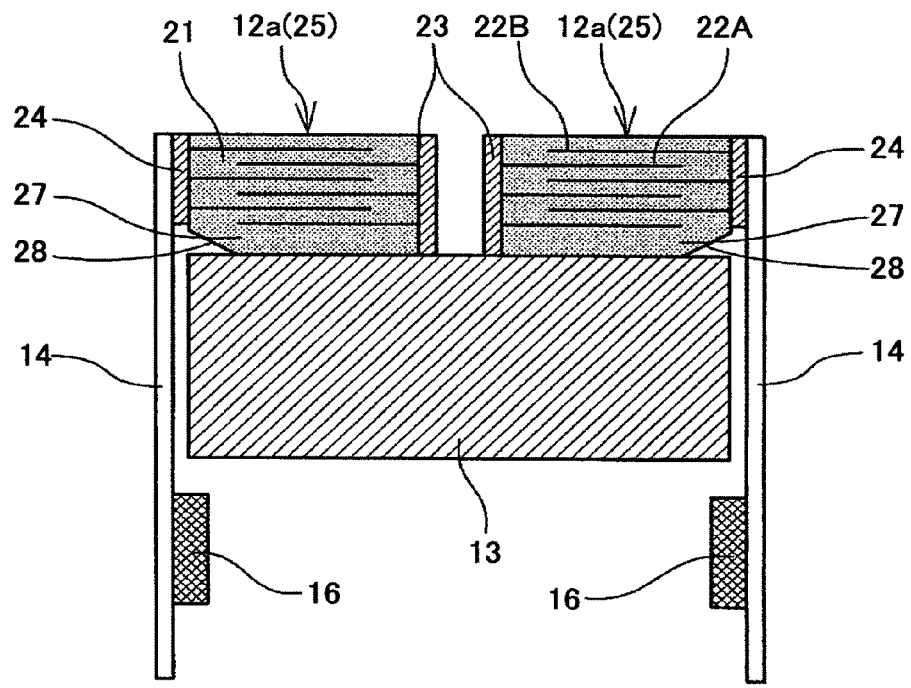
FIG. 23 is a cross-sectional view of the liquid ejecting head shown in FIG. 22 along line A-A of FIG. 22.
Figure 24:
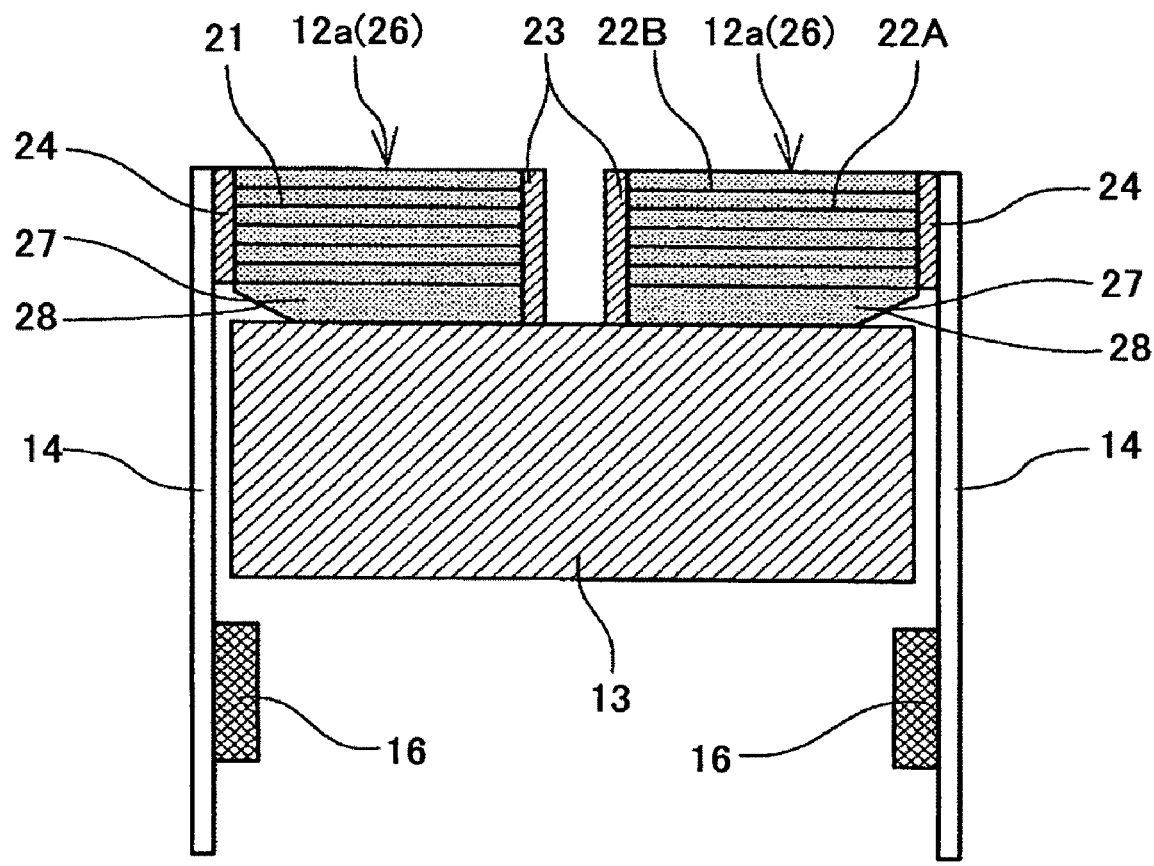
FIG. 24 is a cross-sectional view of the liquid ejecting head shown in FIG. 22 along line B-B of FIG. 22.
Figure 25:
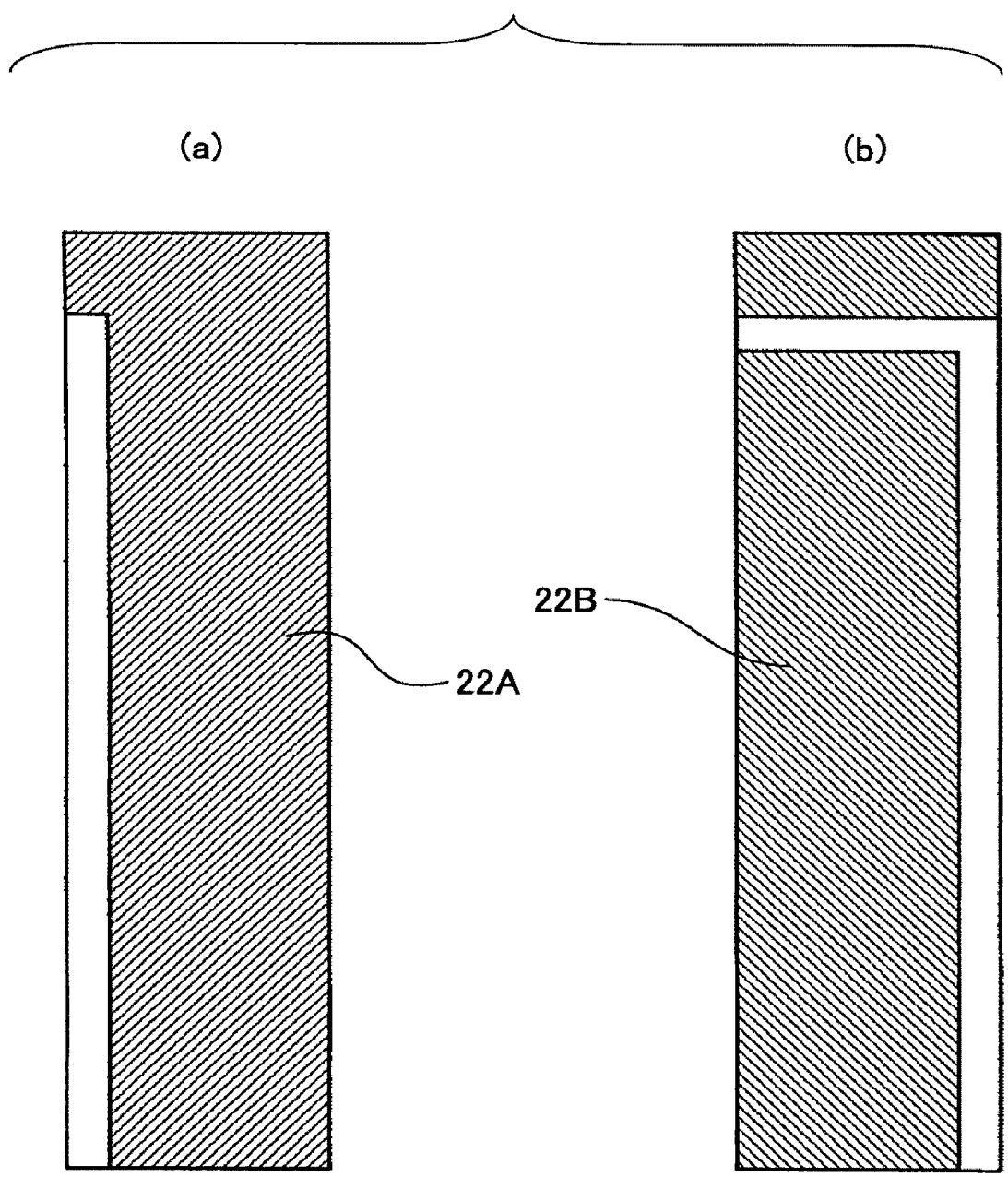
FIG. 25 is a plan view of internal electrodes in a stacked type piezoelectric element shown in FIG. 20.

Next, referring to FIGS. 22 through 25, the piezoelectric element member 12 (the stacked type piezoelectric element 12a) is described in detail. FIG. 22 is a cut-away side view of a part of the liquid ejecting head shown in FIG. 20 in the long-length direction. FIG. 23 is a cross-sectional view of the liquid ejecting head shown in FIG. 22 along line A-A of FIG. 22. FIG. 24 is a cross-sectional view of the liquid ejecting head shown in FIG. 22 along line B-B of FIG. 22. FIG. 25 is a plan view of internal electrodes in the stacked type piezoelectric element 12a.

In the stacked type piezoelectric element 12a, a piezoelectric layer 21 (piezoelectric material layer), an internal electrode 22A having a pattern shown in FIG. 25(a), and an internal electrode 22B having a pattern shown in FIG. 25(b) are alternately stacked. In addition, in the above stacked status, a common side external electrode 23 is formed on one side of the stacked status and an individual side external electrode 24 is formed on the other side of the stacked status. Then, plural grooves 30 are formed by a slitting process. With this, plural stacked type piezoelectric elements 12a are formed. In this case, the stacked type piezoelectric elements 12a at both the ends operate as non-drive sections, and the internal stacked type piezoelectric elements 12a operate as drive sections which give a driving waveform.

In addition, at the connection section between the two adjacent stacked type piezoelectric elements 12a, a gap 31 having a width L1 of approximately 0.03 mm which is the same width as that of the groove 30 is formed by, for example, dicing. Since the gap 31 having the same width as that of the groove 30 is formed at the connection section, the plural stacked type piezoelectric elements 12a can be arrayed so that the connection sections do not exist.

In addition, in the grooving (slitting) process, a bridge section 27 of the width D is formed in the piezoelectric element member 12 without grooving to the surface of the base member 13. With this, the piezoelectric element member 12 can include the plural stacked type piezoelectric elements 12a. Further, a notch 28 is formed at the side of the individual side external electrode 24 of the piezoelectric element member 12 along the arraying direction of the drive sections 25.

The internal electrode 22A of each drive section 25 is connected to the common side external electrode 23, since the common side external electrode 23 is connected via the bridge section 27, the internal electrode 22A of each drive section 25 is connected to the internal electrode 22A of the non-drive section 26 via the common side external electrode 23. In addition, as shown in FIG. 24, since the internal electrode 22A of the non-driver section 26 is connected to the end of the individual side external electrode 24, when the end of the individual side external electrode 24 is connected to the FPC cable 14, the common side external electrode 23 and the individual side external electrode 24 can be at one end of the piezoelectric element member 12.

In the liquid ejecting head, when a driving pulse voltage of 20 to 50 V is selectively applied to the drive section 25 (the stacked type piezoelectric element 12a), the drive section 25 is expanded in the stacked direction and deforms the vibration plate 2 in the direction of the nozzle 5. With this, pressure is applied to ink (recording liquid) in the pressure applying liquid chamber 6 due to a change of the volume of the pressure applying liquid chamber 6, and liquid droplets are ejected from the nozzle 5.

After this, liquid pressure in the pressure applying liquid chamber 6 is lowered by the ejection of the ink droplets and small negative pressure is generated in the pressure applying liquid chamber 6 due to ink flow inertia. Under this, when applying the voltage to the stacked type piezoelectric element 12a is turned off, the vibration plate 2 returns to the original position and the shape of the pressure applying liquid chamber 6 is returned to the original shape; therefore, negative pressure is further generated in the pressure applying liquid chamber 6. With this, liquid (ink) is filled into the pressure applying liquid chamber 6 from the common liquid chamber 18 via the through hole 8 and the fluid resistance section 7 (ink supplying route). After the vibration of the ink meniscus surface of the nozzle 5 is attenuated and the vibration plate 2 becomes stable, a pulse voltage is applied to the stacked type piezoelectric element 12a for next ejection of ink, and ink droplets are ejected.

In the present embodiment, the ink droplets are ejected by a pushing method; however, a pulling method or a pulling and pushing method can be applied. The above methods can be used by changing the driving waveform.

As described above, in the liquid ejecting head, the two piezoelectric element members 12 are arrayed in the long length direction on the base member 13, and in the piezoelectric element member 12, the plural stacked type piezoelectric elements are formed by the grooving process. With this, the number of nozzles 5 can be increased at low cost by connecting the piezoelectric element members 12.

As described above, when the printing speed is desired to be fast, it is effective for the length of the liquid ejecting head to be long and the number of nozzles to be increased. However, when the length of the liquid ejecting head is long, since the length of the piezoelectric member 12 must be long, it is generally difficult to form a long-length piezoelectric element member and to handle the long-length piezoelectric element member. In order to solve the above problem, the piezoelectric element members 12 are arrayed and adhered on the base member 13. With this, a long-length liquid ejecting head can be formed.

In this case, first, the plural piezoelectric element members 12 in which the stacked type piezoelectric elements 12a are not formed are arrayed and adhered on the base member 13. Then the plural stacked type piezoelectric elements 12a are formed by applying a grooving process with the use of a dicing process. The dimensions of the stacked type piezoelectric element 12a can be made precise by the dicing. When the plural piezoelectric element members 12 are arrayed on the base member 13 formed of a material having high rigidity, a position shift between the plural piezoelectric element members 12 can be made small. In addition, since the grooves 30 are formed after arraying the plural piezoelectric element members 12 on the base member 13 by a dicing process, a long-length liquid ejecting head can be obtained without individually handling the fragile stacked type piezoelectric elements 12a having the grooves 30. In addition, the position of the groove 30 can be precisely determined by controlling the dicing process. Further, in order to flatten the surface of the plural piezoelectric element members 12, after adhering the plural piezoelectric element members 12 on the base member 13, the surface of the plural piezoelectric element members 12 may be polished.

In the above, it is preferable that the nozzle plate 3 be formed of a single plate for the plural piezoelectric element members 12. In a case where the nozzle plate 3 is formed of plural plates, when the nozzle surface is wiped, a wiping fault for ink may occur caused by a groove or a step at the connection position between the plural plates, and the image quality may be degraded.

Tenth Embodiment

Figure 26:
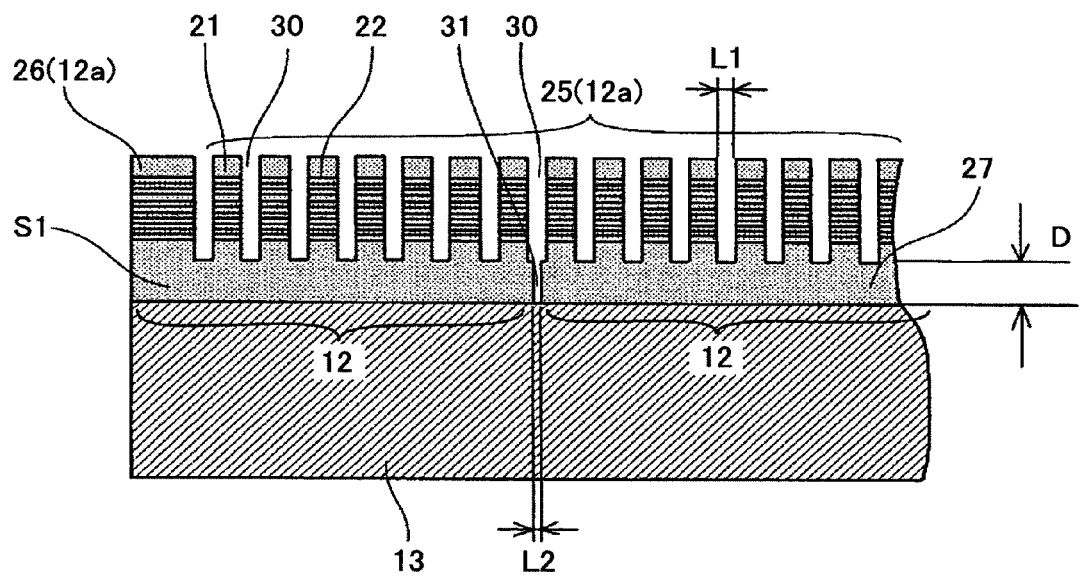
FIG. 26 is a cut-away side view of a part of the liquid ejecting head in the long-length direction according to a tenth embodiment of the present invention.

Next, referring to FIG. 26, a liquid ejecting head according to a tenth embodiment of the present invention is described. FIG. 26 is a cut-away side view of a part of the liquid ejecting head in the long-length direction according to the tenth embodiment of the present invention.

In the tenth embodiment of the present invention, the width L2 of the gap 31 between the two adjacent piezoelectric element members 12 is smaller than the width L1 of the groove 30. That is, L2<L1. Therefore, the groove 30 is formed at the connection position between the two adjacent piezoelectric element members 12.

In FIG. 26, the length of the piezoelectric element member 12 in the long-length direction is 55.0125 mm (tolerance is ±0.005 mm), the width L2 of the gap 31 between the two adjacent piezoelectric element members 12 is 0.01 mm (tolerance is ±0.003 mm), the width L1 of the groove 30 (dicing width) is 0.03 mm (tolerance is ±0.002 mm), and the pitch (interval) between the two adjacent grooves 30 is 0.08465 mm (tolerance is ±0.005 mm). With this, the groove 30 can be formed in the gap 31 between the two adjacent piezoelectric element members 12 within the tolerance.

As described above, when the groove 30 is positioned at the gap 31 between the two adjacent piezoelectric element members 12 and the width L2 of the gap 31 is smaller than the width L1 of the groove 30, the liquid ejecting head can be precisely formed within the tolerance. In the ninth embodiment of the present invention, an adhesive which adheres the piezoelectric element members 12 onto the base member 13 may flow into the gap 31. However, in the tenth embodiment of the present invention, even if the adhesive flows into the gap 31, since the groove 30 is formed at the gap 31, the adhesive is removed from the groove 30.

Eleventh Embodiment

Figure 27:
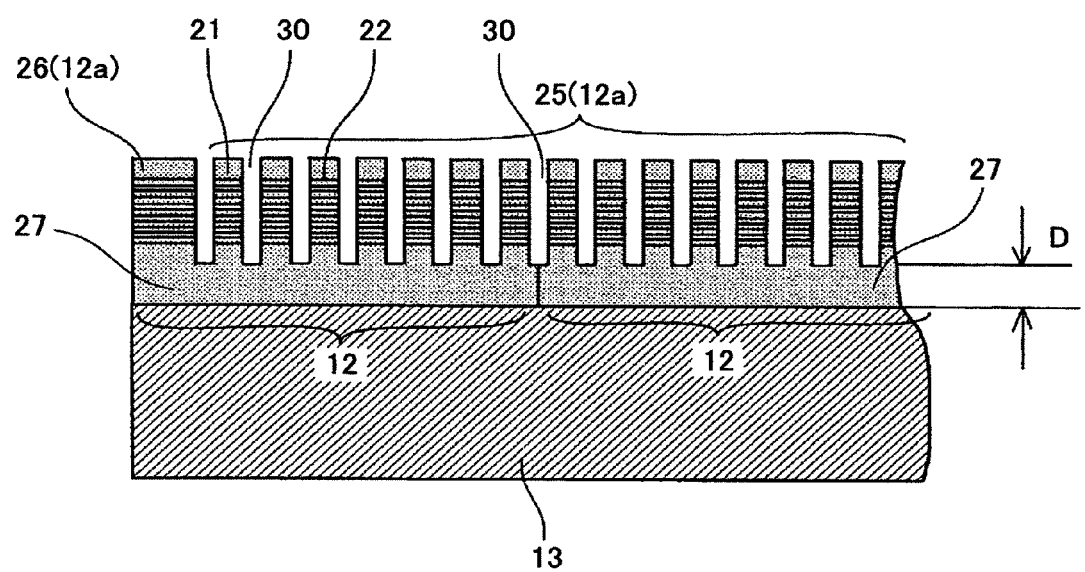
FIG. 27 is a cut-away side view of a part of the liquid ejecting head in the long-length direction according to an eleventh embodiment of the present invention.

Next, referring to FIG. 27, a liquid ejecting head according to an eleventh embodiment of the present invention is described. FIG. 27 is a cut-away side view of a part of the liquid ejecting head in the long-length direction according to the eleventh embodiment of the present invention.

In the eleventh embodiment of the present invention, as shown in FIG. 27, the gap 31 between the two adjacent piezoelectric element members 12 shown in FIG. 26 does not exist. Therefore, the groove 30 is formed at the connection position between the two adjacent piezoelectric element members 12. With this, the same effect as that in the tenth embodiment of the present invention can be obtained.

Twelfth Embodiment

Figure 28:
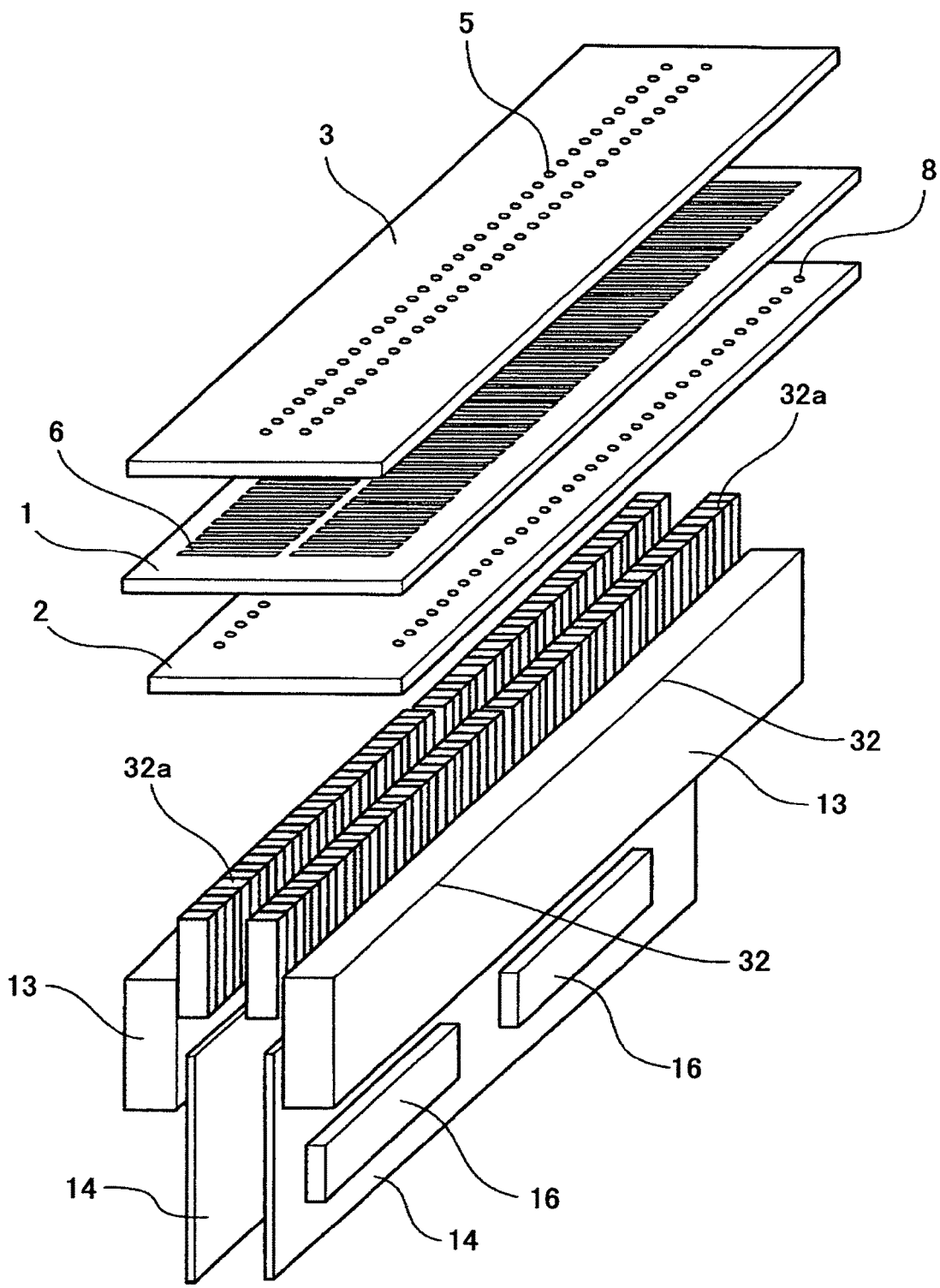
FIG. 28 is an exploded perspective view of a liquid ejecting head according to a twelfth embodiment of the present invention.
Figure 29:
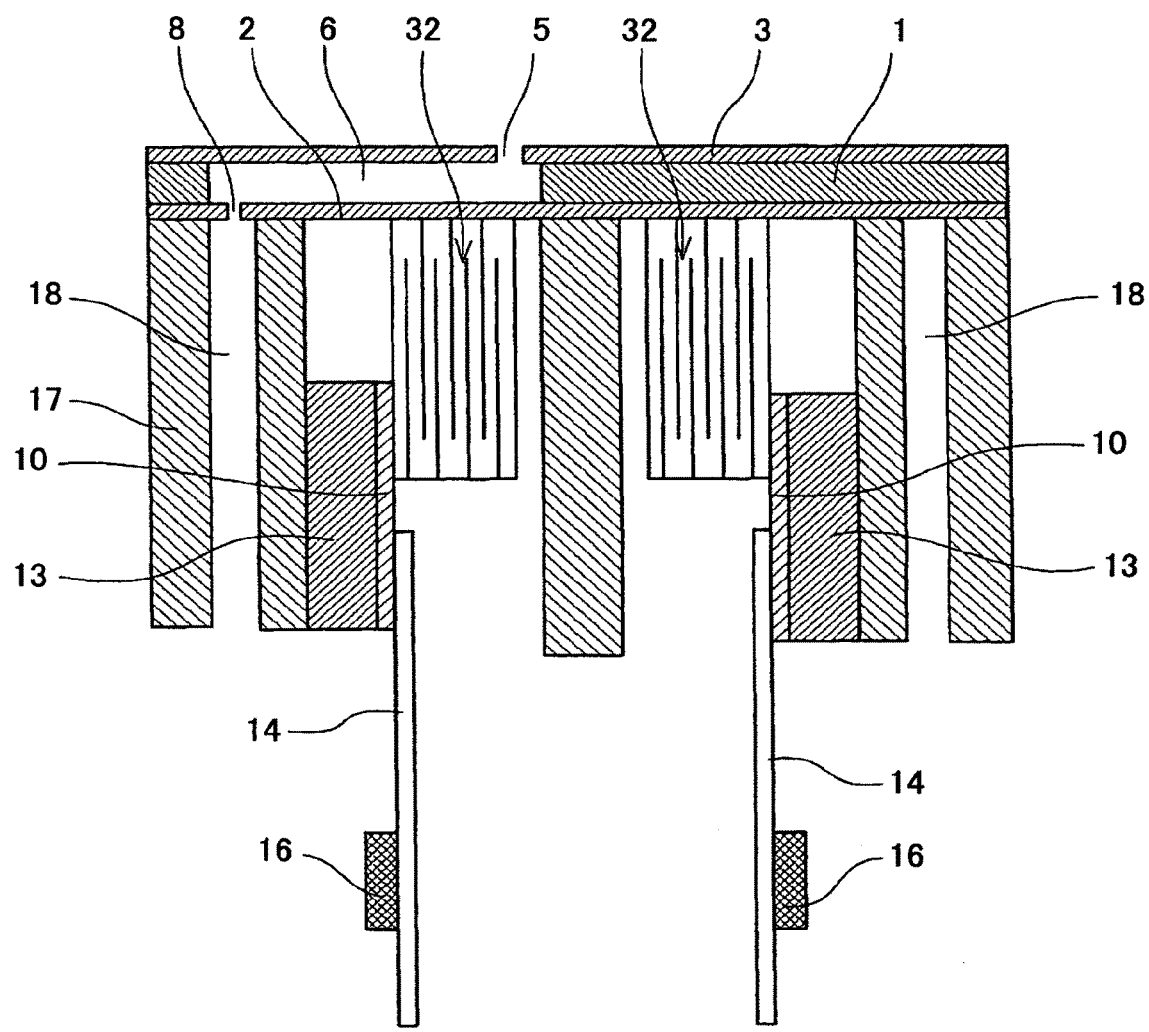
FIG. 29 is a cut-away side view of a part of the liquid ejecting head in the short-length direction of the liquid ejecting head shown in FIG. 28.

Next, referring to FIGS. 28 and 29, a liquid ejecting head according to a twelfth embodiment of the present invention is described. FIG. 28 is an exploded perspective view of a liquid ejecting head according to the twelfth embodiment of the present invention. FIG. 29 is a cut-away side view of a part of the liquid ejecting head in the short-length direction of the liquid ejecting head shown in FIG. 28.

In the above embodiments, pressure is applied to liquid in the pressure applying liquid chamber 6 by using displacement in the d33 direction. However, in the twelfth embodiment of the present invention, the displacement in the d31 direction is used.

In the twelfth embodiment of the present invention, the base member 13 is formed of an insulation material such as ceramics, a thin film electrode 10 is formed on one surface of the base member 13, and a piezoelectric element member 32 is bonded on the surface of the thin film electrode 10 by an adhesive or solder. At this time, the edge of the base member 13 is aligned in parallel with the piezoelectric element member 32 by using a jig and so on. By using a dicer or a wire saw, the piezoelectric element member 12 and the thin film electrode 10 on the base member 13 are simultaneously cut. With this, plural stacked type piezoelectric elements having an equal pitch therebetween are formed, the plural thin film electrodes 10 become corresponding electrodes to the stacked type piezoelectric elements, and the FPC cable 14 is connected to the thin film electrodes 10 by solder or an ACF (anisotropic conductive film). The others are the same as those in the above embodiments of the present invention.

Thirteenth Embodiment

Figure 30:
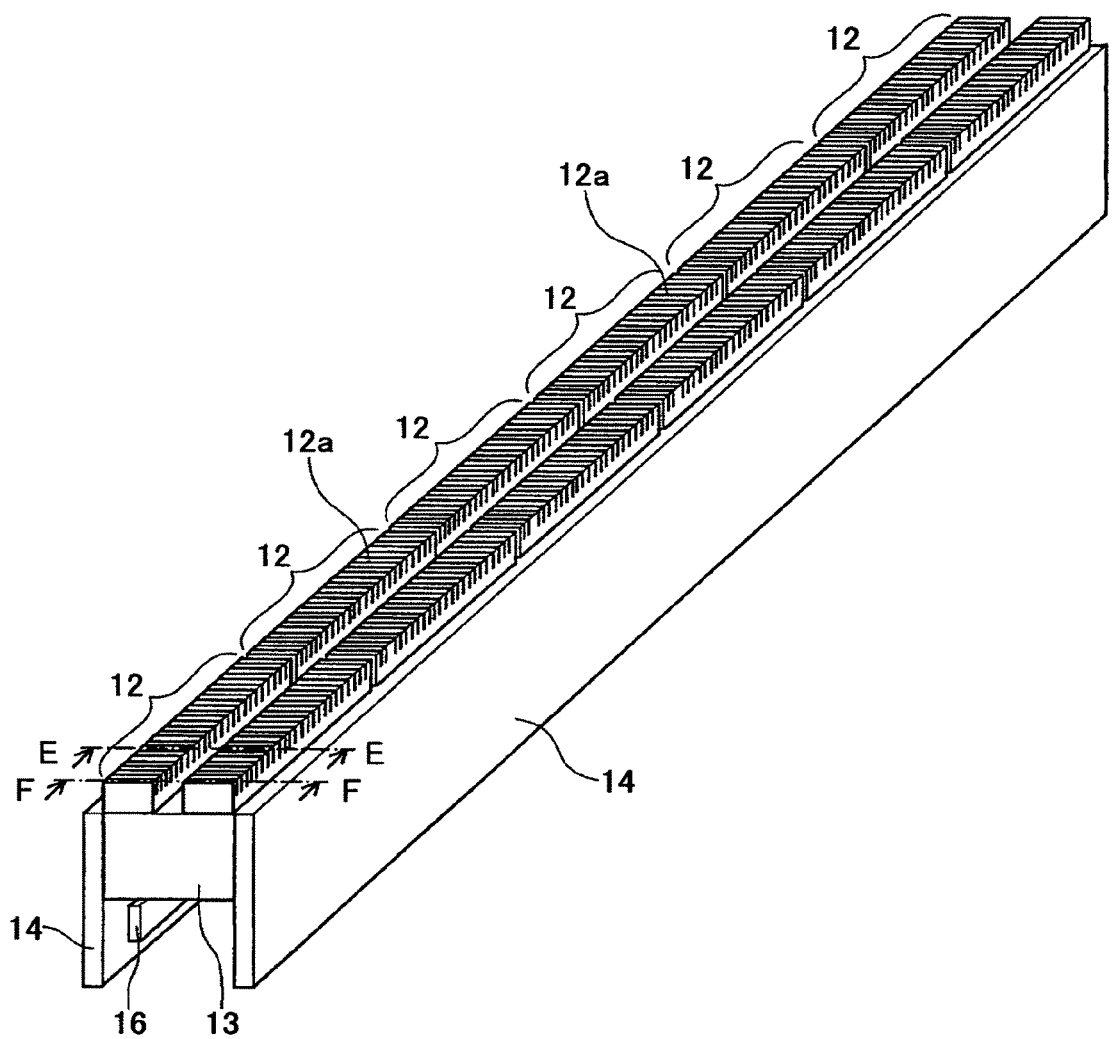
FIG. 30 is a perspective view of a main part of a liquid ejecting head according to a thirteenth embodiment of the present invention.
Figure 31:
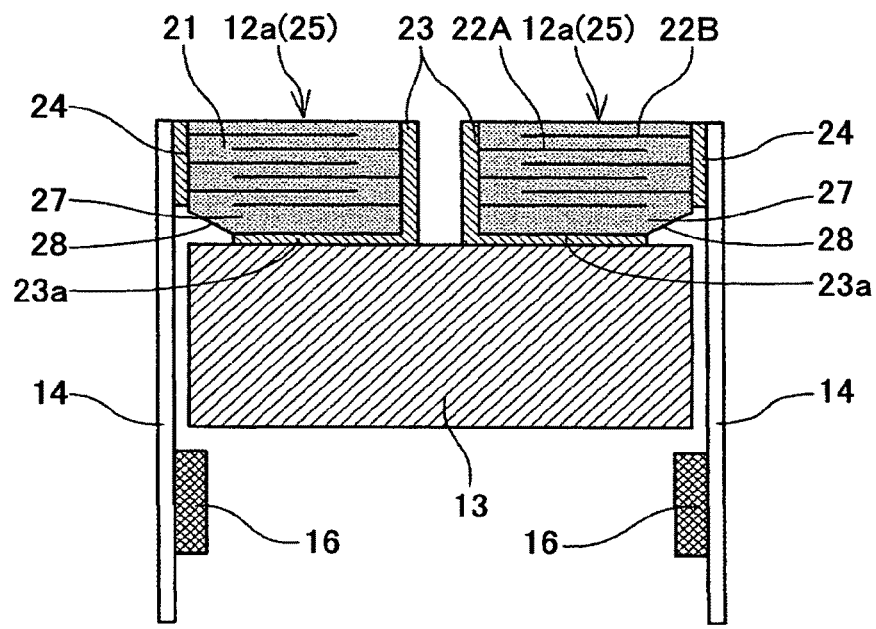
FIG. 31 is a cross-sectional view of the liquid ejecting head shown in FIG. 30 along line E-E of FIG. 30.
Figure 32:
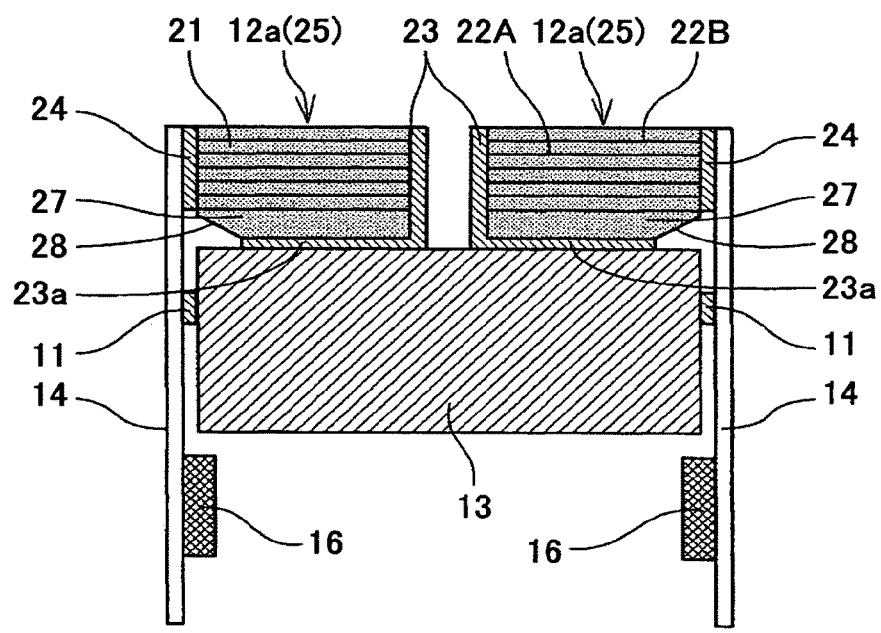
FIG. 32 is a cross-sectional view of the liquid ejecting head shown in FIG. 30 along line F-F of FIG. 30.

Next, referring to FIGS. 30 through 32, a liquid ejecting head according to a thirteenth embodiment of the present invention is described. FIG. 30 is a perspective view of a main part of a liquid ejecting head according to the thirteenth embodiment of the present invention. FIG. 31 is a cross-sectional view of the liquid ejecting head shown in FIG. 30 along line E-E of FIG. 30. FIG. 32 is a cross-sectional view of the liquid ejecting head shown in FIG. 30 along line F-F of FIG. 30.

In the thirteenth embodiment of the present invention, two lines of six piezoelectric element members 12 of the ninth embodiment of the present invention are arrayed in the long-length direction, and a liquid ejecting head of approximately 330 mm length is formed. That is, twelve piezoelectric element members 12 are arrayed. When the length is approximately 330 mm, the short-length width of paper of A3 size (297 mm×420 mm) can be covered by the liquid ejecting head. That is, a line-type liquid ejecting head which can form an image on A3 size paper can be obtained.

In this case, when the two piezoelectric element members 12 are arrayed in the long-length direction as shown in FIG. 20, the common side external electrode 23 can be obtained at the corresponding ends of the two piezoelectric element members 12 in the long-length direction. However, when three or more piezoelectric element members 12 are arrayed in the long-length direction, in the piezoelectric element members 12 positioned inside the liquid ejecting head other than the piezoelectric element members 12 positioned at both the ends, the common side external electrode 23 cannot be at the end thereof.

In order to solve the above problem, the base member 13 is connected to the common side external electrodes 23 of the piezoelectric element members 12. That is, as shown in FIG. 31, the internal electrode 22A is connected to the common side external electrode 23, and the common side external electrode 23 provides an extending section 23a which is extended on the bottom surface of the piezoelectric element member 12. The extending section 23a is electrically connected to the base member 13 formed of a metal material, for example, SUS.

In this case, when the extending section 23a is adhered to the base member 13 by a conductive adhesive, adhesion and electrical connection are simultaneously executed. Therefore, the number of manufacturing processes is reduced; consequently, the cost is reduced.

In addition, as shown in FIG. 32, at the end of the liquid ejecting head, the base member 13 is connected to the FPC cable 14 by solder 11 or an ACF. Consequently, the internal electrode 22A of the piezoelectric element member 12 is connected to the FPC cable 14 via the base member 13.

As described above, when the three or more piezoelectric element members 12 are arrayed in the long-length direction of the liquid ejecting head, the piezoelectric element members 12 are electrically connected to the base member 13 via the common side external electrode 23, and the common side external electrode 23 is connected to the FPC cable 14 via the base member 13. Therefore, even at the center of the long-length liquid ejecting head, a voltage drop is rarely generated.

Fourteenth Embodiment

Figure 33:
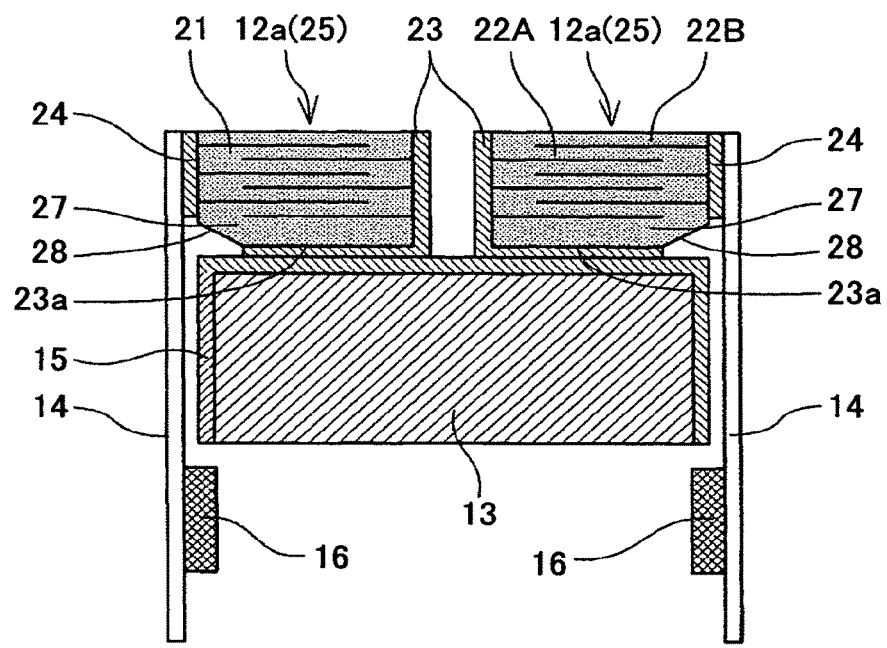
FIG. 33 is a cut-away side view of a center part of a liquid ejecting head according to a fourteenth embodiment of the present invention.
Figure 34:
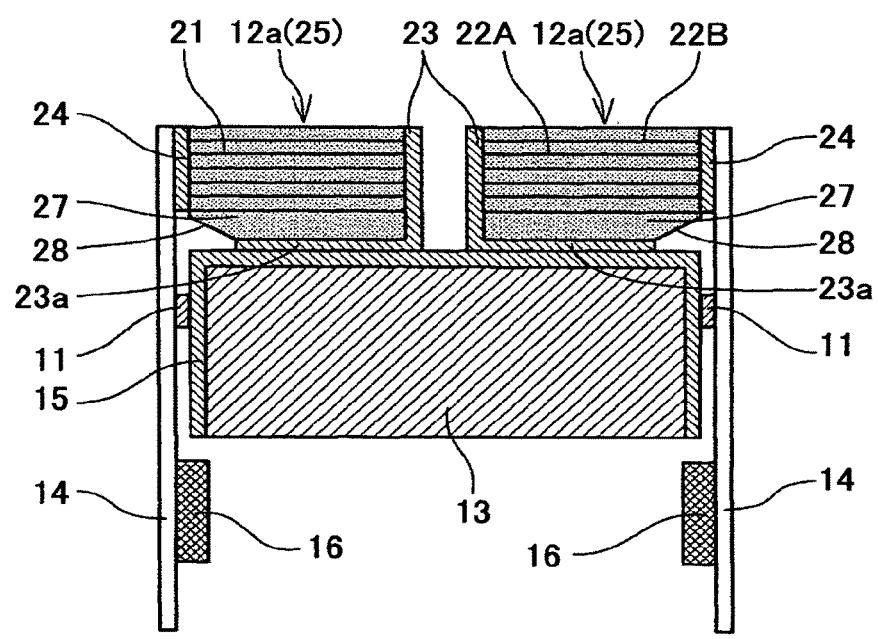
FIG. 34 is a cut-away side view of an end part of the liquid ejecting head according to the fourteenth embodiment of the present invention.

Next, referring to FIGS. 33 and 34, a liquid ejecting head according to a fourteenth embodiment of the present invention is described. FIG. 33 is a cut-away side view of a center part of a liquid ejecting head according to the fourteenth embodiment of the present invention. FIG. 34 is a cut-away side view of an end part of the liquid ejecting head according to the fourteenth embodiment of the present invention.

In the fourteenth embodiment of the present invention, similar to the twelfth embodiment of the present invention, the base member 13 is formed of an insulation material, for example, ceramics; and in addition to the twelfth embodiment of the present invention, an electrode thin film 15 is formed on the surface of the base member 13.

That is, since the length of the base member 13 must be long and thin in the long-length liquid ejecting head, the material of the base member 13 must have high rigidity. In the fourteenth embodiment of the present invention, the material of the base member 13 must not be a conductive material; therefore, a material such as ceramics having higher rigidity than metal can be used for the base member 13.

Fifteenth Embodiment

Figure 35:
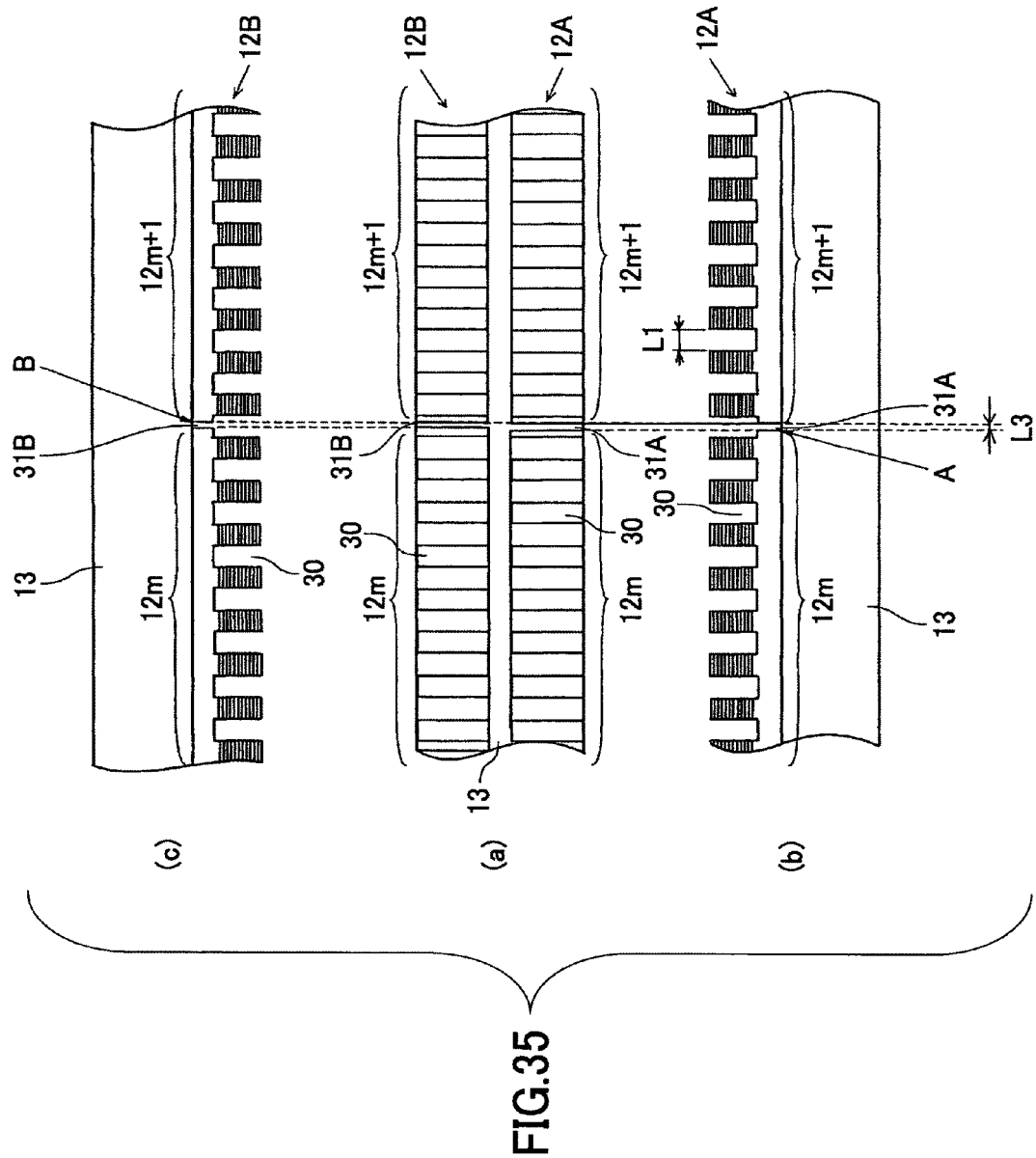
FIG. 35 is a diagram showing a liquid ejecting head according to a fifteenth embodiment of the present invention.

Next, referring to FIG. 35, a liquid ejecting head according to a fifteenth embodiment of the present invention is described. FIG. 35 is a diagram showing the liquid ejecting head according to the fifteenth embodiment of the present invention. In FIG. 35, (a) shows a plan view, (b) shows a side view taken from the lower side of the liquid ejecting head, and (c) shows another side view taken from the upper side of the liquid ejecting head.

In the fifteenth embodiment of the present invention, plural piezoelectric element members 12 are arrayed in plural lines. In FIG. 35, two lines of the plural piezoelectric element members 12 are arrayed, and a first line is called 12A and a second line is called 12B.

In the first line 12A, a gap 31A is formed between an $m^{th}$ piezoelectric element member 12$m$ and an $(m+1)^{th}$ piezoelectric element member 12$m$+1 (m is an integer being 1 or more), and in the second line 12B, a gap 31B is formed between an $m^{th}$ piezoelectric element member 12$m$ and an $(m+1)^{th}$ piezoelectric element member 12$m$+1.

In FIG. 35, in the first line 12A, the width L3 of the gap 31A between the $m^{th}$ piezoelectric element member 12$m$ and the $(m+1)^{th}$ piezoelectric element member 12$m$+1 is determined to be smaller than the width L1 of the groove 30. Similar to the above, the width of the gap 31B is smaller than the width L1 in the second line 12B.

That is, when a position of the most negative side (the most right side in FIG. 35) of the $m^{th}$ piezoelectric element member 12$m$ is defined as A and a position of the most positive side (the most left side in FIG. 35) of the $(m+1)^{th}$ piezoelectric element member 12$m$+1 is defined as B, the width between A and B is smaller than the width L1 of the groove 30.

As described above, since the width L3 is smaller than the width L1 of the groove 30, even if the width of the gap 31A is different from the width of the gap 31B, both the gaps 31A and 31B can be within the width L1 of the groove 30.

Sixteenth Embodiment

Figure 36:
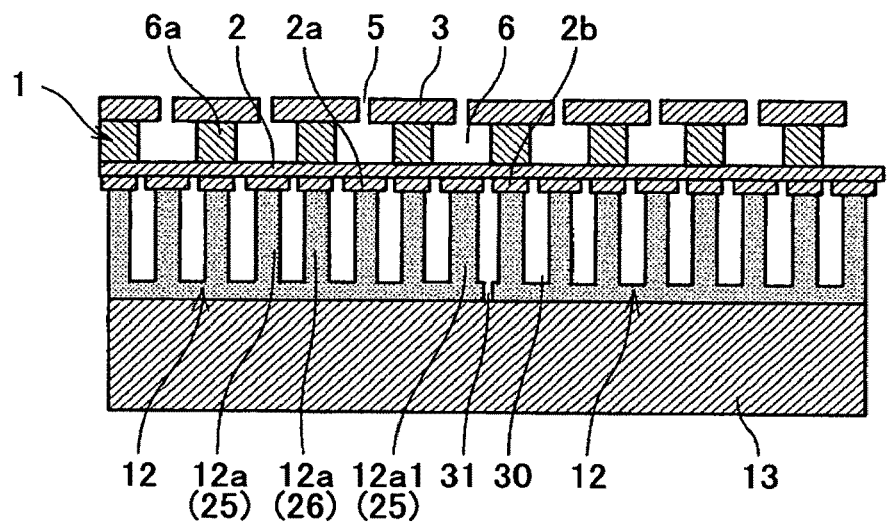
FIG. 36 is a cut-away side view of a first part of a liquid ejecting head according to a sixteenth embodiment of the present invention.
Figure 37:
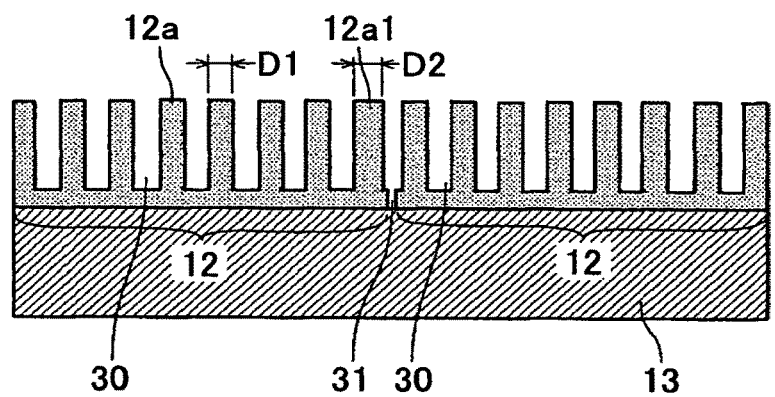
FIG. 37 is a cut-away side view of a second part of the liquid ejecting head according to the sixteenth embodiment of the present invention.
Figure 38:
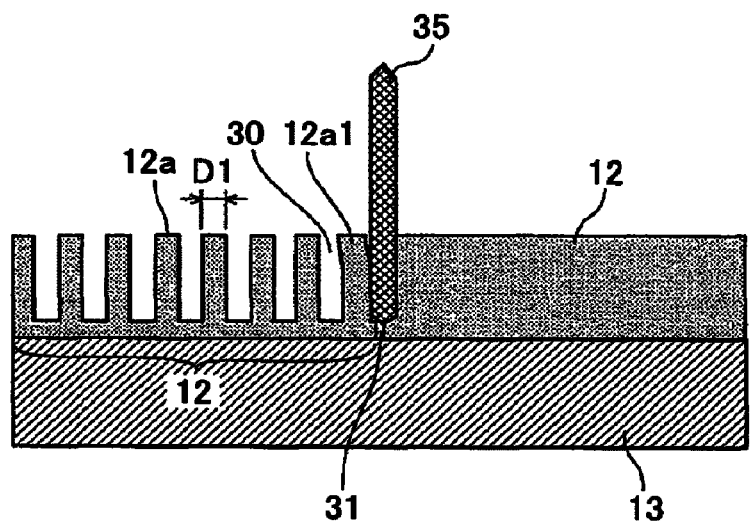
FIG. 38 is a cut-away side view of a third part of the liquid ejecting head according to the sixteenth embodiment of the present invention.

Next, referring to FIGS. 36 through 38, a liquid ejecting head according to a sixteenth embodiment of the present invention is described. FIG. 36 is a cut-away side view of a first part of a liquid ejecting head according to the sixteenth embodiment of the present invention. FIG. 37 is a cut-away side view of a second part of the liquid ejecting head according to the sixteenth embodiment of the present invention. FIG. 38 is a cut-away side view of a third part of the liquid ejecting head according to the sixteenth embodiment of the present invention.

In the sixteenth embodiment of the present invention, a bi-pitch structure is used. In the bi-pitch structure, the plural stacked type piezoelectric elements 12$a$ are separated into the drive section 25 to which a driving waveform is applied and the non-drive section 26 to which the driving waveform is not applied, and the drive section 25 and the non-drive section 26 are alternately disposed in the piezoelectric element member 12. In addition, on the vibration plate 2, thick convex sections 2$a$ and 2$b$ are formed, and the drive section 25 (the stacked type piezoelectric element 12$a$) is adhered to the thick convex section 2$a$ and the non-drive section 26 (the stacked type piezoelectric element 12$a$) is adhered to the thick convex section 2$b$.

As described above, when the thick convex sections 2$a$ and 2$b$ are formed on the vibration plate 2, even if dispersion among the widths of the stacked type piezoelectric elements 12$a$ in the nozzle arraying direction occur, dispersion of the liquid droplet volumes among the nozzles 5 can be reduced.

As shown in FIG. 37, when the grooves 30 are formed in the piezoelectric element member 12 adhered to the base member 13, the width D2 of the stacked type piezoelectric element 12$a$1 positioned at the end may be wider than the width D1 of another stacked type piezoelectric element 12$a$ (D2>D1).

As shown in FIG. 38, when the groove 30 is formed by dicing at the connection position between the two adjacent piezoelectric element members 12, a stress is applied to the end of the stacked type piezoelectric element 12$a$1 by a dicing blade 35 in which piezoelectric element member 12 the grooves 30 have been formed; consequently, the groove 30 is formed at the connection position by being deformed in the direction where the grooves 30 have been formed. Therefore, the width D2 becomes larger than the width D1.

In the sixteenth embodiment of the present invention, as described above, the thick convex sections 2$a$ and 2$b$ are formed on the vibration plate 2. The width of the thick convex section 2$a$ is formed to be the same as the width of the pressure applying liquid chamber 6. The thick convex section 2$b$ is formed under a separation wall 6$a$ of the pressure applying liquid chamber 6.

When the thick convex section 2$a$ does not exist, since the width D1 of the stacked type piezoelectric element 12$a$ is different from the width D2 of the stacked type piezoelectric element 12$a$1, the area (width) of the vibration plate 2 to be deformed is different at positions between the stacked type piezoelectric elements 12$a$ and 12$a$1, and the volume of the liquid droplets to be ejected is different between the pressure applying liquid chambers 6 positioned between the stacked type piezoelectric elements 12$a$ and 12$a$1. However, when the thick convex sections 2$a$ are formed on the vibration plate 2 and the stacked type piezoelectric elements 12$a$ and 12$a$1 are adhered to the corresponding thick convex sections 2$a$, even if the width D1 of the stacked type piezoelectric element 12$a$ is different from the width D2 of the stacked type piezoelectric element 12$a$1, the area (width) of the vibration plate 2 to be deformed is determined by the width of the thick convex section 2$a$. With this, pressure applying to the pressure applying liquid chambers 6 corresponding to the stacked type piezoelectric elements 12$a$ and 12$a$1 becomes the same and dispersion of the volumes of the liquid droplets to be ejected from the nozzles 5 is reduced. Therefore, degradation of image quality can be prevented.

The thick convex sections 2$a$ and 2$b$ can be integrally formed with the vibration plate 2 by using, for example, a nickel electroforming process. Or the vibration plate 2 is formed of a resin film and the thick convex sections 2$a$ and 2$b$ are formed by a metal material such as SUS by applying patterning and etching. The thick convex sections 2$a$ and 2$b$ is not limited to a single layer, and can be formed by plural layers. In the case of the plural layers, the area can be different among the layers.

Seventeenth Embodiment

Figure 39:
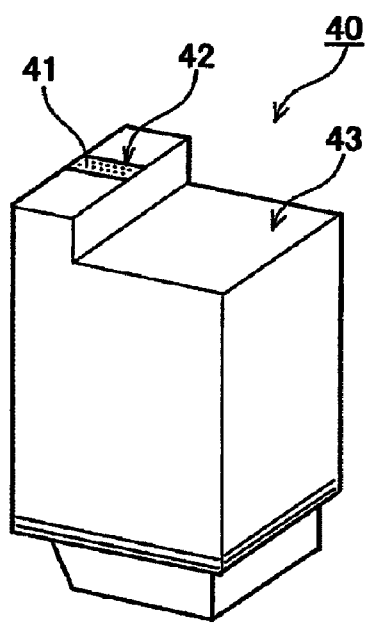
FIG. 39 is a perspective of an ink cartridge integrated with a liquid ejecting head according to a seventeenth embodiment of the present invention.

Next, referring to FIG. 39, an ink cartridge integrated with a liquid ejecting head according to a seventeenth embodiment of the present invention is described. FIG. 39 is a perspective of the ink cartridge integrated with the liquid ejecting head according to the seventeenth embodiment of the present invention. In the seventeenth embodiment of the present invention, in some elements, the reference number is different from that in the above embodiments.

In the seventeenth embodiment of the present invention, as shown in FIG. 39, an ink cartridge 40 includes a liquid ejecting head 41 (inkjet head) having nozzles 42 and an ink tank 43 from which ink is supplied to the liquid ejecting head 41. When the liquid ejecting head described in the above embodiments is used as the liquid ejecting head 41, the ink cartridge 40 integrated with the liquid ejecting head 41 can be obtained at low cost and a small size.

Eighteenth Embodiment

Figure 40:
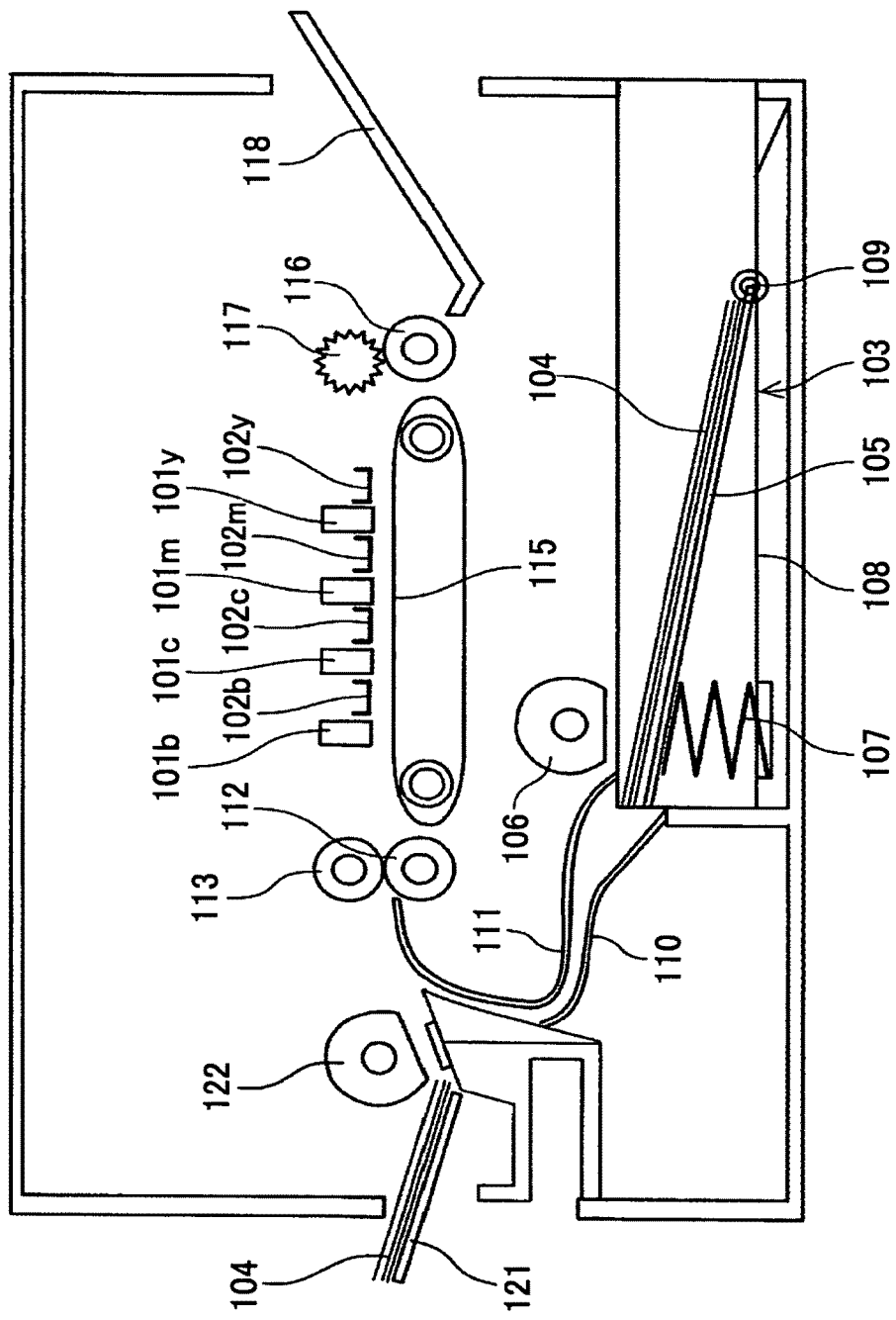
FIG. 40 is a cut-away side view of an image forming apparatus according to an eighteenth embodiment of the present invention.

Next, referring to FIG. 40, an image forming apparatus including a liquid ejecting head according to an eighteenth embodiment of the present invention is described. FIG. 40 is a cut-away side view of the image forming apparatus according to the eighteenth embodiment of the present invention. In the eighteenth embodiment of the present invention, the reference number of each element is different from that in the above embodiments.

The image forming apparatus shown in FIG. 40 is a line type image forming apparatus having a full line type liquid ejecting head. The full line type liquid ejecting head provides nozzle lines having a length more than a printing region on a recording medium.

The image forming apparatus ejects color liquid droplets of, for example, black (K), cyan (C), magenta (M), and yellow (Y). That is, the image forming apparatus includes four liquid ejecting heads (recording heads) 101*b*, 101*c*, 101*m*, and 101*y*. In the following, when a suffix is not attached to a reference number of an element, the reference number represents the set of elements. The recording head 101 is supported by a head holder (not shown) so that the nozzle surface faces in the lower direction. In addition, a maintaining and recovering mechanism 102 is provided for the recording head 101 to maintain the performance of the recording head 101 and recover from an abnormal condition. When the performance of the recording head 101 is maintained, for example, at a purging process and a wiping process of the recording head 101, by relatively moving the recording head 101 or the maintaining and recovering mechanism 102, a capping member (not shown) of the maintaining and recovering mechanism 102 is moved to face the nozzle surface of the recording head 101.

In the image forming apparatus shown in FIG. 40, color liquid droplets are ejected in the order of black, cyan, magenta, and yellow from the paper carrying upstream direction; however, the positions of the recording heads 101 and the number of colors are not limited to the above. In addition, in the line type recording head, one or plural recording heads can be used. In this case, one recording head ejects plural color ink droplets by having plural nozzles disposed at a predetermined interval. Further, the recording head 101 can be unified with a recording liquid cartridge from which recording liquid is supplied to the recording head 101.

A paper feeding tray 103 includes a bottom plate 105 on which paper 104 is stored and a paper feeding roller 106 having a half-moon shape for feeding the paper 104. The bottom plate 105 can be rotated around a rotational shaft 109 attached to a base 108, and is pressed to the side of the paper feeding roller 106 by a pressure applying spring 107. In order to prevent the paper 104 from being double fed, a paper separation pad (not shown) formed of artificial leather or cork having a high friction coefficient is provided to face the paper feeding roller 106. In addition, a release cam (not shown) is provided to release touching the bottom plate 105 with the paper feeding roller 106.

In addition, in order to carry the paper 104 fed from the paper feeding tray 103 between a carrying roller 112 and a pinch roller 113, guiding members 110 and 111 for guiding the paper 104 are provided.

The carrying roller 112 is rotated by a driving source (not shown) and carries the paper 104 to a platen 115 disposed to face the recording head 101. The platen 105 can be formed of a rigid material or be a carrying belt which can maintain a gap between the recording head 101 and the paper 104.

A paper outputting roller 116 and a spur 117 facing the paper outputting roller 116 are provided at the downstream side of the platen 115. The paper 104 on which an image is formed is output to a paper outputting tray 118 by the paper outputting roller 116.

In addition, at the side opposite to the paper outputting tray 118, a paper manually feeding tray 121 for manually feeding the paper 104 and a paper feeding roller 122 for feeding the paper 104 put on the paper manually feeding tray 121 are provided. The paper 104 fed from the paper manually feeding tray 121 is carried between the carrying roller 112 and the pinch roller 113 by being guided by the guiding member 111.

In the image forming apparatus shown in FIG. 40, the release cam pushes the bottom plate 105 of the paper feeding tray 103 down to a predetermined position and does not touch the bottom plate 105 with the paper feeding roller 106 in the standby mode. When the carrying roller 112 is rotated and the rotation driving force is transferred to the paper feeding roller 106 and the release cam via a gear (not shown), the release cam is separated from the bottom plate 105 and the bottom plate 105 is raised. With this, the paper feeding roller 106 touches the paper 104, and the paper 104 is started to be picked up one by one with the rotation of the paper feeding roller 106 by being separated by a separation claw (not shown).

Next, the paper 104 is carried between the carrying roller 112 and the pinch roller 113 by the guidance of the guiding members 110 and 111 with the rotation of the paper feeding roller 106. Then the paper 104 is carried on the platen 115 by the carrying roller 112. In this, the end of the paper 104 is released from the paper feeding roller 106 by the D-cut part of the paper feeding roller 106. In addition, a pair of carrying rollers can be disposed between the paper feeding roller 106 and the carrying roller 112 as an auxiliary.

Then the recording head 101 ejects recording liquid on the paper 104 being carried on the platen 115 and an image is formed on the paper 104. The paper 104 on which the image is formed is output on the paper outputting tray 118 by the paper outputting roller 116. The speed of the paper 104 and the ejection timing of liquid droplets are controlled by a controller (not shown) when an image is formed on the paper 104.

As described above, by providing the line type liquid ejecting head of the embodiment of the present invention, a high quality image can be formed at high speed in the image forming apparatus.

Nineteenth Embodiment

Figure 41:
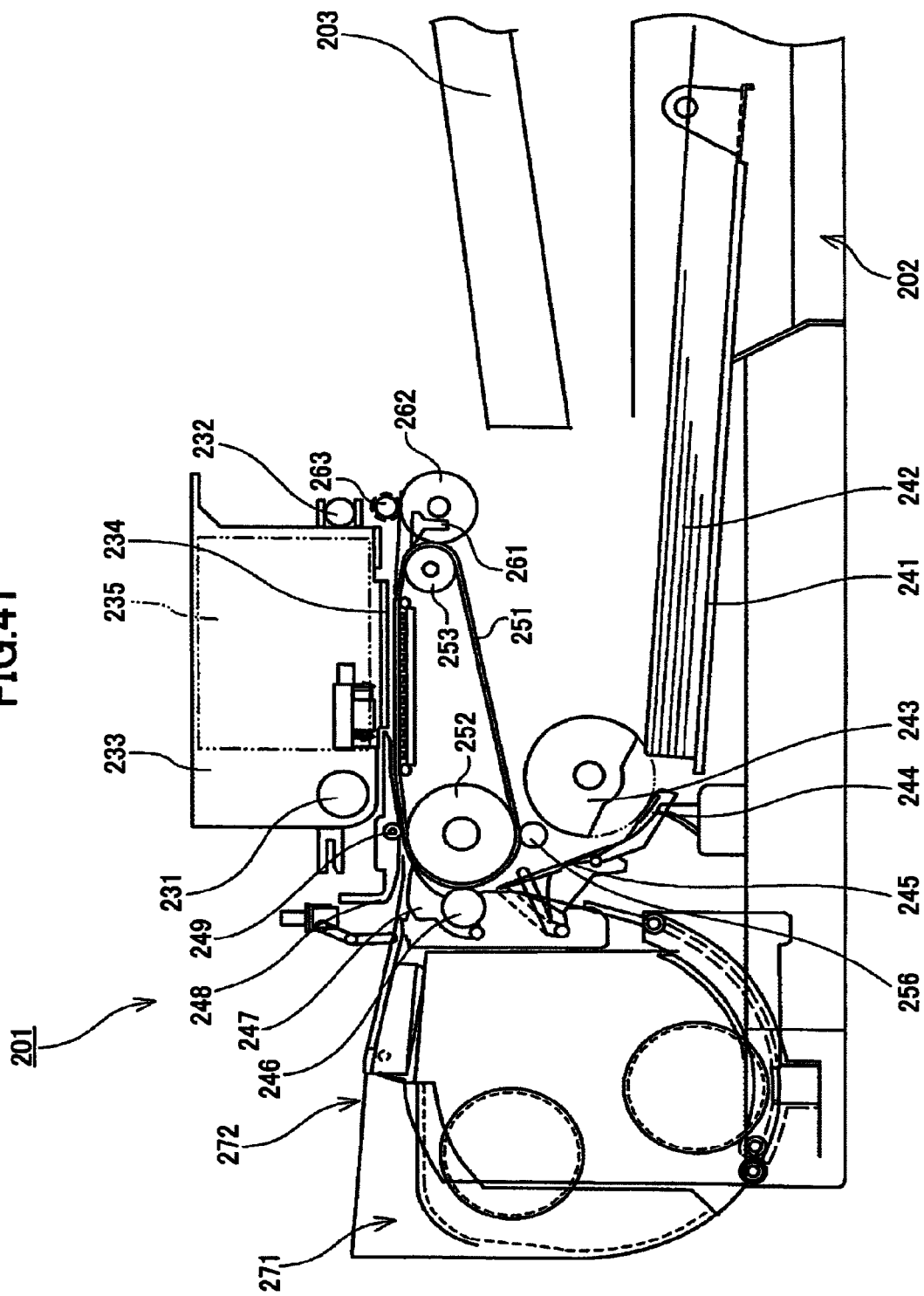
FIG. 41 is a cut-away side view of a mechanical part of an image forming apparatus according to a nineteenth embodiment of the present invention.
Figure 42:
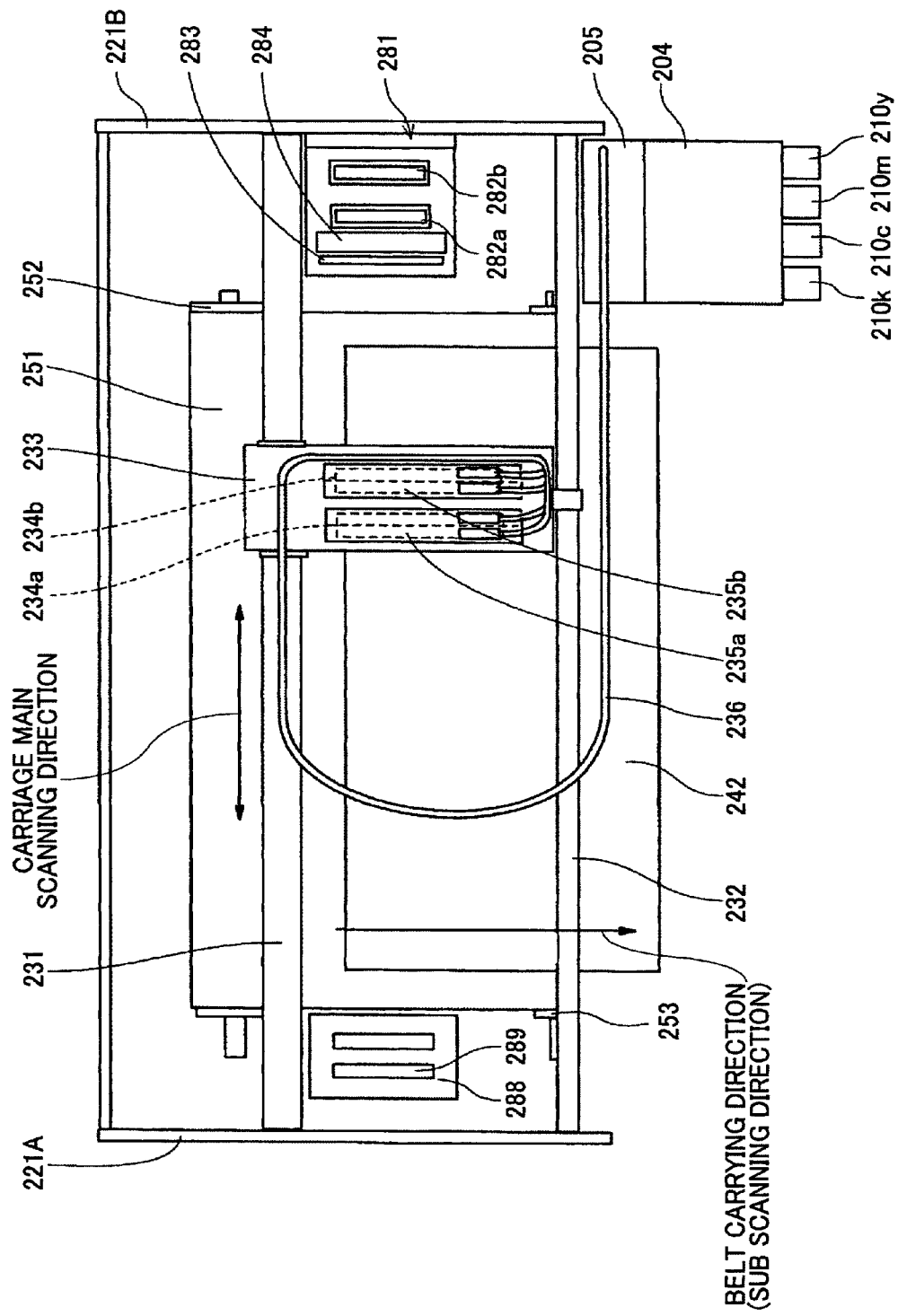
FIG. 42 is a plan view of a main part of the mechanical part shown in FIG. 41.

Next, referring to FIGS. 41 and 42, another image forming apparatus including a liquid ejecting head according to a nineteenth embodiment of the present invention is described. FIG. 41 is a cut-away side view of a mechanical part of the image forming apparatus according to the nineteenth embodiment of the present invention. FIG. 42 is a plan view of a main part of the mechanical part shown in FIG. 41. In the nineteenth embodiment of the present invention, the reference number of each element is different from that in the eighteenth embodiment of the present invention. In addition, in the following, when a suffix is not attached to a reference number of an element, the reference number represents the set of elements.

The image forming apparatus shown in FIG. 41 is a serial type image forming apparatus. A carriage 233 is slidably supported in the main scanning direction by a main guide rod 231 and a sub guide rod 232 bridged between a left side plate 221A and a right side plate 221B. The carriage 233 moves and scans in the carriage main scanning direction (the arrow direction) by a main scanning motor (not shown) via a timing belt.

In the carriage 233, liquid ejecting heads 234a and 234b (recording heads) for ejecting color ink droplets of yellow (Y), cyan (C), magenta (M), and black (K) are provided. In the recording head 234, nozzle lines are arrayed in the sub scanning direction orthogonal to the main scanning direction and the ink droplets are ejected in the downward direction.

The recording head 234a has two nozzle lines and one of the two nozzle lines ejects black (K) ink droplets and the other thereof ejects cyan (C) ink droplets. The recording head 234b has two nozzle lines and one of the two nozzle lines ejects magenta (M) ink droplets and the other thereof ejects yellow (Y) ink droplets.

Head tanks 235a and 235b for supplying color ink to the corresponding recording heads 234a and 234b are loaded in the carriage 233. Each color ink (recording liquid) is supplied to the head tank 235 from a recording liquid cartridge 210 detachably loaded in a cartridge loading section 204 by a supplying pump unit 205 via a supplying tube 236.

In addition, as shown in FIG. 41, in the image forming apparatus, in order to feed paper 242 being stored in a paper storing section 241 of a paper feeding tray 202 one by one, a paper feeding roller 243 (half-moon roller) and a paper separation pad 244 formed of a material having a high friction coefficient facing the paper feeding roller 243 are provided. The paper separation pad 244 is pushed to the side of the paper feeding roller 243.

In addition, in order to carry the paper 242 fed from the paper feeding tray 202 to a position under the recording head 234, in the image forming apparatus, a guiding member 245 for guiding the paper 242, a counter roller 246, a paper carrying guide member 247, and a paper pushing member 248 having a tip pressure applying roller 249 are provided. Further, in the image forming apparatus, a carrying belt 251 for carrying the paper 242 at a position facing the recording head 234 is provided.

The carrying belt 251 is an endless belt and is wound around a carrying roller 252 and a tension roller 253, and is rounded in the sub scanning direction. In addition, in the image forming apparatus, a charging roller 256 for charging the surface of the carrying belt 251 is provided. The charging roller 256 is rotated by the rotation of the carrying belt 251 in touch with the surface of the carrying belt 251. The carrying belt 251 is rounded by the rotation of the carrying roller 252 rotated by a sub scanning motor (not shown) via a timing belt.

In addition, the image forming apparatus provides a separation claw 261 for separating the paper 242 on which an image is formed by the recording head 234 from the carrying belt 251, and paper outputting rollers 262 and 263 for outputting the paper 242 to a paper outputting tray 203.

In addition, in the image forming apparatus, a both sides printing unit 271 is detachably loaded at the back side of an apparatus main body 201. The both sides printing unit 271 obtains the paper 242 returned by inverse rotation of the carrying belt 251 and reverses the paper 242 and supplies the reversed paper 242 between the counter roller 246 and the carrying belt 251. Further, a paper manually feeding tray 272 is provided on the upper surface of the both sides printing unit 271.

In addition, a maintaining and recovering mechanism 281 is provided for maintaining the nozzles of the recording head 234 in a normal condition and recovering the nozzles from an abnormal condition at one side in the non-printing region in the main scanning direction of the carriage 233.

The maintaining and recovering mechanism 281 provides cap members 282a and 282b for capping the nozzle surface of the recording head 234, a wiper blade 283 for wiping the nozzle surface, and a liquid collecting unit 284 which collects recording liquid becoming high viscosity during the recording and not contributing the recording by blank ejection.

In addition, a liquid collecting unit 288 is provided at the other side in the non-printing regions in the main scanning direction of the carriage 233. The liquid collecting unit 288 collects recording liquid becoming high viscosity during the recording and not contributing the recording by blank ejection. The ink collecting unit 288 includes an opening 289 along the nozzle lines of the recording head 234.

In the image forming apparatus, the paper 242 is fed from the paper feeding tray 202 one by one, and the paper 242 fed in the almost vertical direction is guided by the guiding member 245, and is carried by being sandwiched between the carrying belt 251 and the counter roller 246. Further, the tip of the paper 242 is guided by the paper carrying guide member 247 and is pushed on the carrying belt 251 by the tip pressure applying roller 249 and the carrying direction of the paper 242 is changed by approximately 90°.

At this time, an alternate voltage is applied to the charging roller 256 and a charged pattern is formed on the carrying belt 251 in which pattern plus and minus voltages are alternately charged with a predetermined width in the sub scanning direction. When the paper 242 is carried on the carrying belt 251, the paper 242 is absorbed on the carrying belt 251 and is carried in the sub scanning direction.

Then the recording head 234 is driven corresponding to an image signal while moving the carriage 233, and the recording head 234 ejects ink droplets (liquid droplets) on the stopped paper 242. With this, one line image is recorded on the paper 242. After this, the paper 242 is moved by a predetermined amount and a second line image is recorded. When a recording end signal or a signal in which the back end of the paper 242 reaches a non-recording region is received, the image forming apparatus ends the recording operation and outputs the paper 242 to the paper outputting tray 203.

As described above, even in the serial type image forming apparatus, when a long-length liquid ejecting head in the embodiment of the present invention is used, since the recording range by one scanning can be large, a high quality image can be recorded at high speed.

In the embodiments of the present invention, the liquid ejecting head of the present invention is used in a printer; however, the liquid ejecting head can be applied to a facsimile, a copier, and a multifunctional apparatus having the above functions. In addition, the present invention can be applied to an image forming apparatus which uses recording liquid other than ink and image fixing processing liquid.

In addition, in the embodiments of the present invention, the liquid ejecting head is used in the image forming apparatus. However, the liquid ejecting head of the embodiments of the present invention can be used in a liquid ejecting head which ejects liquid resist for patterning and in a liquid ejecting head which ejects a sample for gene analysis.

Twentieth Embodiment

Figure 43:
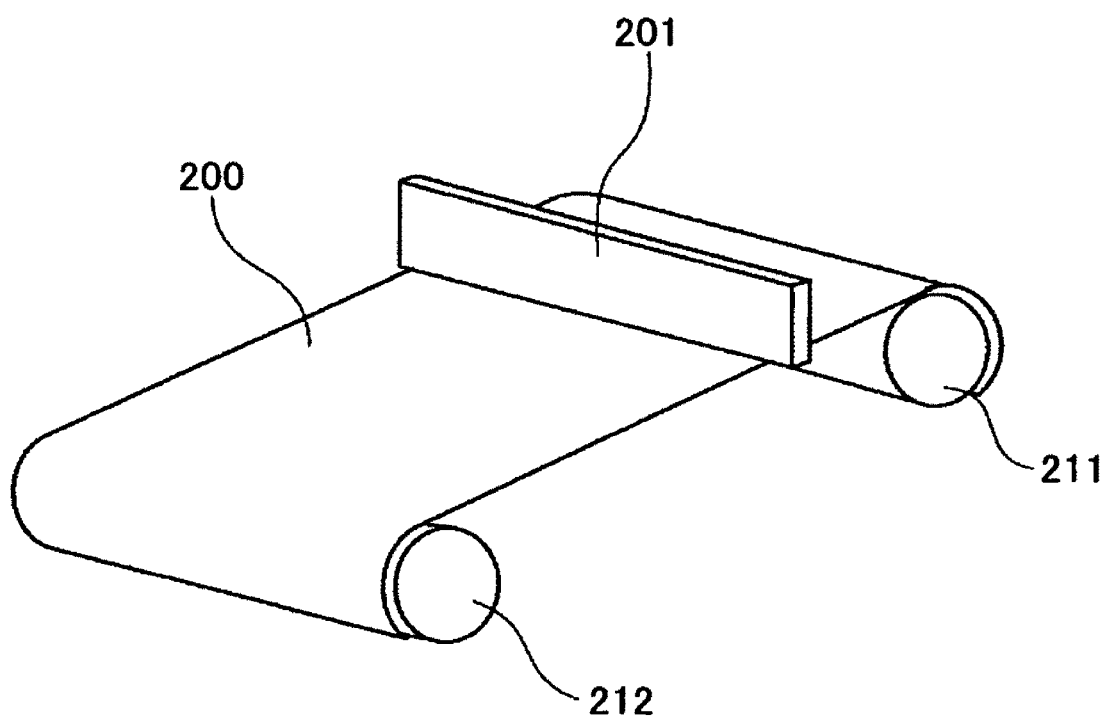
FIG. 43 is a perspective view of an image forming apparatus according to a twentieth embodiment of the present invention.

Next, referring to FIG. 43, a twentieth embodiment of the present invention is described. FIG. 43 is a perspective view of an image forming apparatus according to the twentieth embodiment of the present invention.

In the twentieth embodiment of the present invention, in some elements, the reference number is different from that in the above embodiments.

The image forming apparatus shown in FIG. 43 includes a full line type liquid ejecting head 201 on which plural nozzles are formed in the recordable region of a recording medium (paper) 200 which is carried by a carrying roller 211 and a paper feeding roller 212. The full line type liquid ejecting head 201 is disposed to cross a paper carrying route of the paper 200 and forms an image on the recordable region of the paper 200.

In the image forming apparatus using the full line type liquid ejecting head, when thin paper or normal paper is used, ink penetrates into the paper and the paper is expanded by the ink, and cockles are formed in the paper. That is, the paper may touch the head by cockling. In this case, the cockling may be avoided by preventing the penetration of the ink into the paper with the use of high viscosity ink. In addition, in the image forming apparatus using the full line type liquid ejecting head, since one line image is formed by one scanning, a liquid ejecting head is required in which nozzles and ink supplying routes are arrayed in high density.

The liquid ejecting head of the embodiments of the present invention can be arrayed in high density and can be used in high viscosity ink. Therefore, the liquid ejecting head of the embodiments of the present invention can be used in the image forming apparatus using a full line type liquid ejecting head.

Further, the present invention is not limited to the specifically disclosed embodiments, and variations and modifications may be made without departing from the scope of the present invention.

The present invention is based on Japanese Priority Patent Application No. 2006-112712, filed on Apr. 14, 2006, and Japanese Priority Patent Application No. 2007-038610, filed on Feb. 19, 2007, with the Japanese Patent Office, the entire contents of which are hereby incorporated herein by reference.

What is claimed is:

1. An image forming apparatus which forms an image on a recording medium, comprising:
  a liquid ejecting head which ejects recording liquid on the recording medium for forming the image on the recording medium,
  wherein the liquid ejecting head includes
    a nozzle that ejects liquid;
    a liquid chamber connected to the nozzle;
    a vibration plate of which at least one wall of the liquid chamber is formed; and
    a piezoelectric actuator that deforms the vibration plate,
  wherein a piezoelectric actuator including:
    a base member; and
    three or more piezoelectric element members in which a plurality of piezoelectric elements are formed by slits,
  wherein the three or more piezoelectric element members are arrayed in a line on the base member and in a same direction as the plurality of piezoelectric elements are arrayed,
  the three or more piezoelectric element members are arrayed with a gap between two adjacent piezoelectric element members, and
  an index is formed on the base member so that the three or more piezoelectric element members are arrayed with the gap between two adjacent piezoelectric element members.

2. The image forming apparatus as claimed in claim 1, wherein the slit is formed at position of the gap.

3. The image forming apparatus as claimed in claim 1, wherein the width of the gap is less than or equal to the width of the slit.

4. The image forming apparatus as claimed in claim 1, wherein a common electrode which applies a driving waveform to the piezoelectric elements is electrically connected to the base member.

5. The image forming apparatus as claimed in claim 4, wherein the common electrode is connected to the base member by a conductive adhesive.

6. The image forming apparatus as claimed in claim 1, wherein, for each piezoelectric element member, a width B of the slits which are formed between the piezoelectric elements, a width C of the piezoelectric elements, a number n of slits in a specific piezoelectric element member and between piezoelectric element members in the specific piezoelectric element member, and a length PW of the specific piezoelectric element member satisfy the inequality $(B+C) \times (n+1) \geqq PW > B \times n + C(n+1)$, and the accuracy of the length of the specific piezoelectric element members is 5 μm or less.

7. The image forming apparatus as claimed in claim 1, wherein the three or more piezoelectric element members each further include bridge sections formed between the plurality of piezoelectric elements formed in each of the three or more piezoelectric element members, the bridge sections not being slit to a surface of the base member.

8. The image forming apparatus as claimed in claim 1, wherein the piezoelectric actuator further includes a thin film electrode, wherein the thin film electrode is formed on a surface of the base member between the base member and the three or more piezoelectric element members.

9. An image forming apparatus which forms an image on a recording medium, comprising:
  a liquid ejecting head which ejects recording liquid on the recording medium for forming the image on the recording medium, wherein
  the liquid ejecting head includes
    a nozzle that ejects liquid;
    a liquid chamber connected to the nozzle;
    a vibration plate of which at least one wall of the liquid chamber is formed; and
    a piezoelectric actuator that deforms the vibration plate, wherein
  a piezoelectric actuator including:
    a base member; and
    three or more piezoelectric element members in which a plurality of piezoelectric elements are formed by slits, wherein
  the three or more piezoelectric element members are arrayed in a lineon the base member and in a same direction as the plurality of piezoelectric elements are arrayed,
  the three or more piezoelectric element members are arrayed with a gap between two adjacent piezoelectric element members, and
  an index is formed on the base member so that the three or more piezoelectric element members are arrayed with the gap between two adjacent piezoelectric element members, and wherein
  at least a part of the slit is formed at one end or both ends of the piezoelectric element members, and
  two of the three or more piezoelectric element members are arrayed such that adjacent ends thereof are positioned within a width of the index.

10. The image forming apparatus as claimed in claim 9, wherein the width of the index is equal to or less than a width of the slits which form the piezoelectric elements.

11. The image forming apparatus according to claim 1, wherein at least one index is formed on each of the base member and the at least three piezoelectric element members.

* * * * *